United States Patent
Jung et al.

(10) Patent No.: US 11,864,364 B2
(45) Date of Patent: Jan. 2, 2024

(54) WEARABLE ELECTRONIC DEVICE INCLUDING HEAT DISSIPATION STRUCTURE

(71) Applicant: Samsung Electronics Co., Ltd., Suwon-si (KR)

(72) Inventors: Sangchul Jung, Suwon-si (KR); Hansang Kim, Suwon-si (KR); Yonghyun Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 45 days.

(21) Appl. No.: 17/674,302

(22) Filed: Feb. 17, 2022

(65) Prior Publication Data

US 2022/0248572 A1    Aug. 4, 2022

Related U.S. Application Data

(63) Continuation of application No. PCT/KR2022/001236, filed on Jan. 24, 2022.

(30) Foreign Application Priority Data

Feb. 3, 2021  (KR) .......... 10-2021-0015311

(51) Int. Cl.
*H05K 7/20* (2006.01)
*G02B 27/01* (2006.01)
(Continued)

(52) U.S. Cl.
CPC ..... *H05K 7/20963* (2013.01); *G02B 27/0176* (2013.01); *G06F 1/163* (2013.01); *G02B 2027/0178* (2013.01)

(58) Field of Classification Search
USPC .......................................................... 345/8
See application file for complete search history.

(56) References Cited

U.S. PATENT DOCUMENTS 9,585,285 B2   2/2017  Nikkhoo et al.
9,839,166 B2  12/2017  Kim et al.
(Continued)

FOREIGN PATENT DOCUMENTS

| JP | 2016-116182 A | 6/2016 |
| KR | 10-1879601 B1 | 8/2018 |
| WO | 2020/171246 A1 | 8/2020 |

OTHER PUBLICATIONS

International Search Report dated May 9, 2022, issued in International Application No. PCT/KR2022/001236.

*Primary Examiner* — Chineyere D Wills-Burns
(74) *Attorney, Agent, or Firm* — Jefferson IP Law, LLP

(57) ABSTRACT

A wearable electronic device is provided. The wearable electronic device includes a housing including a first portion constituting a first outer surface of the wearable electronic device and a second portion constituting a second outer surface of the wearable electronic device, at least one electronic component positioned in an inner space of the housing and configured to emit heat, and multiple support structures which are at least partially positioned to correspond to the at least one electronic component between the first portion and the second portion, wherein a boundary part between the first portion and the second portion is at least partially positioned along a surface boundary between the first outer surface and the second outer surface and includes at least one opening, and an at least one distancing space between the multiple support structures is configured to communicate with an outer space of the housing through the at least one opening.

21 Claims, 14 Drawing Sheets

(51) Int. Cl.
  *G06F 1/16*  (2006.01)
  *G06F 1/20*  (2006.01)

(56) References Cited

U.S. PATENT DOCUMENTS

| | | | |
|---|---|---|---|
| 9,851,585 B2 | 12/2017 | Ashwood | |
| 10,108,017 B2 | 10/2018 | Nikkhoo et al. | |
| 10,579,114 B1 * | 3/2020 | Mills | G06F 1/203 |
| 10,823,969 B1 * | 11/2020 | Hoover | H01M 10/653 |
| 2010/0224354 A1 * | 9/2010 | Dooley | B32B 37/025 |
| | | | 977/932 |
| 2013/0044042 A1 * | 2/2013 | Olsson | G02B 27/0172 |
| | | | 345/8 |
| 2015/0061996 A1 * | 3/2015 | Gustafsson | G06F 3/013 |
| | | | 345/156 |
| 2016/0131902 A1 * | 5/2016 | Ambrus | G06F 3/013 |
| | | | 345/156 |
| 2017/0081578 A1 * | 3/2017 | Kato | C09K 5/10 |
| 2017/0167714 A1 * | 6/2017 | Hong | H05K 1/053 |
| 2018/0136491 A1 * | 5/2018 | Ashwood | G02C 11/08 |
| 2018/0365490 A1 * | 12/2018 | Agrawal | G06V 40/193 |
| 2018/0376626 A1 * | 12/2018 | Hurbi | G02B 7/002 |
| 2019/0041666 A1 * | 2/2019 | Abele | G02B 27/00 |
| 2019/0104650 A1 | 4/2019 | McGinty et al. | |
| 2020/0217565 A1 * | 7/2020 | Boukai | F25B 21/02 |
| 2020/0241611 A1 | 7/2020 | Allin et al. | |
| 2021/0011303 A1 * | 1/2021 | Andreev | G02B 27/58 |

* cited by examiner

WEARABLE ELECTRONIC DEVICE INCLUDING HEAT DISSIPATION STRUCTURE

CROSS-REFERENCE TO RELATED APPLICATION(S)

This application is a continuation application, claiming priority under § 365(c), of an International application No. PCT/KR2022/001236, filed on Jan. 24, 2022, which is based on and claims the benefit of a Korean patent application number 10-2021-0015311, filed on Feb. 3, 2021, in the Korean Intellectual Property Office, the disclosure of which is incorporated by reference herein in its entirety.

TECHNICAL FIELD

The disclosure relates to a wearable electronic device including a heat dissipation structure. More particularly, the disclosure relates to a wearable electronic device including a heat dissipation structure for improving heat dissipation efficiency and improving durability or aesthetic appearance of the wearable electronic device.

BACKGROUND ART

Electronic devices have been developed to improve portability and accessibility, and thus various types of wearable electronic devices have been developed such that users can wear the same. Such wearable electronic devices include, for example, smart glasses. The smart glasses may be wearable computer glasses, for example, configured to add visual information (for example, virtual image) to what is actually seen by the wearer (for example, actual image) or to provide augmented reality (AR) that adds the visual information together with what is seen by the wearer.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

A wearable electronic device may have heat generated by a battery due to a component that consumes a large amount of current, such as a processor (for example, application processor (AP)), communication module, or charging module, or due to current consumption by such a component. For example, if the processor has many tasks to handle, or if the communication module is driven to continuously catch signals, more heat than normal may be generated. Such heat may degrade performance of the wearable electronic device, or may even cause battery explosion. Restrictions on design of the wearable electronic device or slimness of the wearable electronic device may make it difficult to arrange an active structure, such as a cooling fan.

Aspects of the disclosure are to address at least the above-mentioned problems and/or disadvantages and to provide at least the advantages described below. Accordingly, an aspect of the disclosure is to provide a wearable electronic device including a heat dissipation structure.

Additional aspects will be set forth in part in the description which follows and, in part, will be apparent from the description, or may be learned by practice of the presented embodiments.

Solution to Problem

In accordance with an aspect of the disclosure, a wearable electronic device is provided. The wearable electronic device includes a housing including a first portion constituting a first outer surface of the wearable electronic device and a second portion constituting a second outer surface of the wearable electronic device, at least one electronic component positioned in an inner space of the housing and configured to emit heat, and multiple support structures which are at least partially positioned to correspond to the at least one electronic component between the first portion and the second portion, wherein a boundary part between the first portion and the second portion is at least partially positioned along a surface boundary between the first outer surface and the second outer surface and includes at least one opening, and an at least one distancing space between the multiple support structures is configured to communicate with an outer space of the housing through the at least one opening.

Advantageous Effects of Invention

A wearable electronic device including a heat dissipation structure according to an embodiment of the disclosure can not only improve heat dissipation efficiency, but also improve durability or aesthetic appearance of the wearable electronic device.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
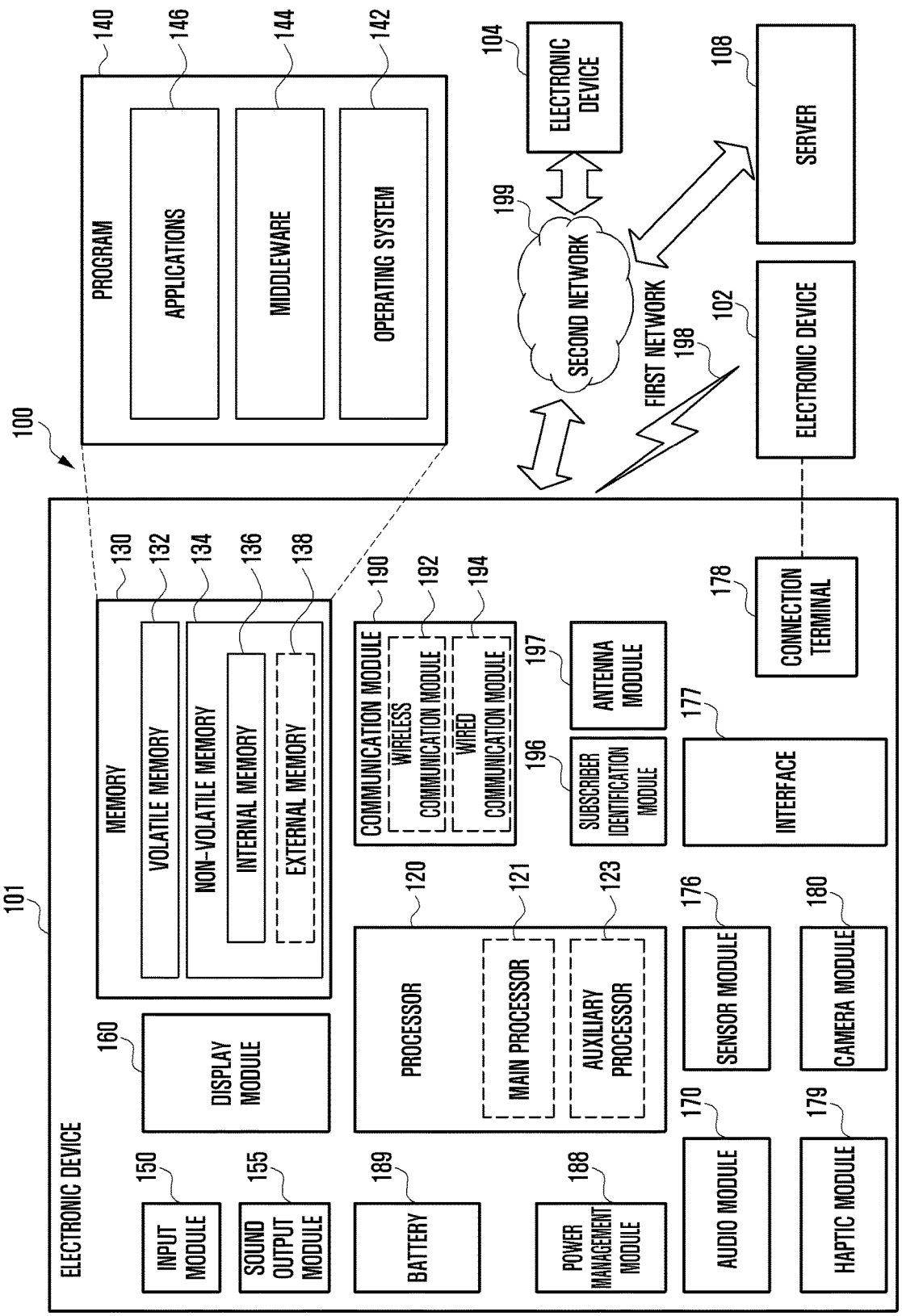
FIG. 1 is a block diagram of an electronic device in a network environment according to an embodiment of the disclosure.

FIG. 1 is a block diagram of an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). The electronic device 101 may communicate with the external electronic device 104 via the server 108. The electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, and/or an antenna module 197. In some embodiments of the disclosure, at least one (e.g., the connection terminal 178) of the components may be omitted from the electronic device 101, or one or more other components may be added in the electronic device 101. In some embodiments of the disclosure, some of the components may be implemented as single integrated circuitry. For example, the sensor module 176, the camera module 180, or the antenna module 197 may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in a volatile memory 132, process the command or the data stored in the volatile memory 132, and store resulting data in a non-volatile memory 134. The processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., a sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, the auxiliary processor 123 (e.g., a neural network processing device) may include a hardware structure specified for processing an artificial intelligence model. The artificial intelligence model may be created through machine learning. Such learning may be performed, for example, in the electronic device 101 itself on which the artificial intelligence model is performed, or may be performed through a separate server (e.g., the server 108). The learning algorithms may include, for example, supervised learning, unsupervised learning, semi-supervised learning, or reinforcement learning, but is not limited thereto. The artificial intelligence model may include a plurality of artificial neural network layers. The artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-network, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an external electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connecting terminal 178 may include a connector via which the electronic device 101 may be physically connected with the external electronic device (e.g., the external electronic device 102). The connecting terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the external electronic device 102, the external electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or IR data association (IrDA)) or the second network 199 (e.g., a long-range communication network, such as a legacy cellular network, a 5th generation (5G) network, a next generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network, after a 4th generation (4G) network, and next-generation communication technology, e.g., new radio (NR) access technology. The NR access technology may support high-speed transmission of high-capacity data (i.e., enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) to achieve, for example, a high data transmission rate. The wireless communication module 192 may support various technologies for securing performance in a high-frequency band, such as beamforming, massive multiple-input and multiple-output (MIMO), full-dimensional MIMO (FD-MIMO), array antenna, analog beam-forming, or large-scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate for implementing eMBB (e.g., 20 Gbps or more), loss coverage for implementing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the external electronic devices 102 or 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide an ultra-low delay service using, for example, distributed computing or MEC. In another embodiment of the disclosure, the external electronic device 104 may include an internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on 5G communication technology or IoT-related technology.

An electronic device according to an embodiment of the disclosure may be one of various types of electronic devices. The electronic devices may include a portable communication device (e.g., a smartphone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAY-STORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2:
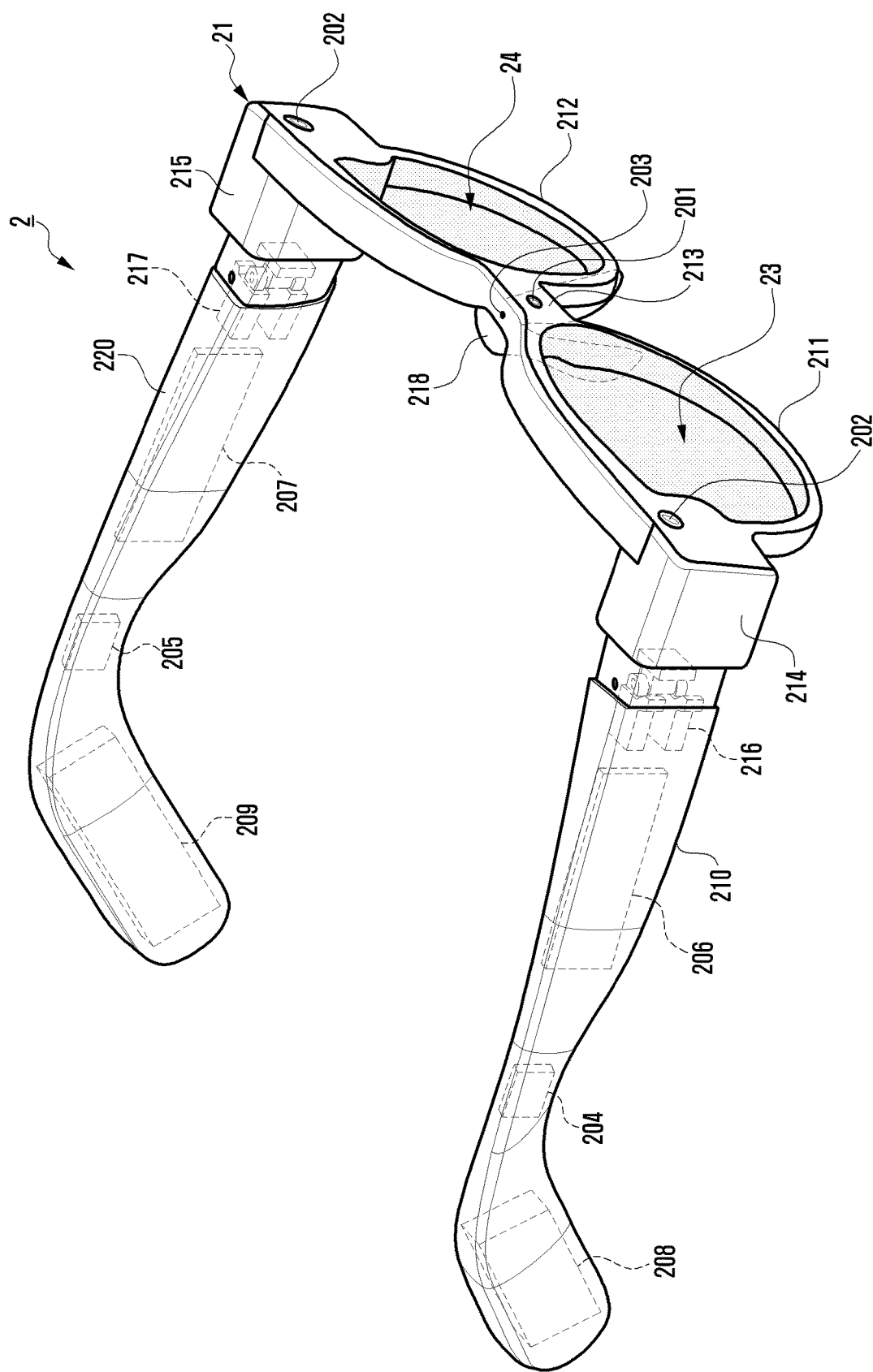
FIG. 2 is a perspective view of a wearable electronic device according to an embodiment of the disclosure.

FIG. 2 is a perspective view of a wearable electronic device according to an embodiment of the disclosure.

Referring to FIG. 2, a wearable electronic device 2 may be an eyeglasses type and for example, may include a frame 21, a first transparent display 23, and a second transparent display 24. The frame 21 may support the first transparent display 23 and the second transparent display 24 and may enable same to be positioned in front of the eyes when being worn on the head of a user.

For example, the frame 21 may include a first rim 211, a second rim 212, a bridge 213, a first end piece 214, a second end piece 215, a first temple 210 (e.g., a glasses leg), a second temple 220, or a nose pad 218. The first rim 211 may at least partially surround and support the first transparent display 23. The second rim 212 may at least partially surround and support the second transparent display 24. The bridge 213 may connect the first rim 211 and the second rim 212, and may be positioned on the nose of a user. The first end piece 214 may connect the first rim 211 and the first temple 210. The second end piece 215 may connect the second rim 212 and the second temple 220. The first temple 210 may be a foldable portion connected to the first end piece 214 by means of a first hinge 216, and may have an end portion formed in a shape bent toward the rear of a right ear to allow same to be put on the right ear. The second temple 220 may be a foldable portion connected to the second end piece 215 by means of a second hinge 217, and may have an end portion formed in a shape bent toward the rear of a left ear to allow same to be put on the left ear. The nose pad 218 may be a portion for supporting the frame 21 on the nose. When the frame 21 is worn on the head of a user, the first transparent display 23 may be positioned in front of the right eye of a wearer, and the second transparent display 24 may be positioned in front of the left eye of the wearer. A wearer may see a foreground (e.g., a real image) in front of the eyes through the first transparent display 23 and the second transparent display 24.

According to some embodiments of the disclosure, the frame 21 may be implemented in various types which can be worn on the head of a user while allowing the first transparent display 23 and the second transparent display 24 to be positioned in front of the eyes. The wearable electronic device 2 may include various electronic components positioned or received in the frame 21, and in some embodiments of the disclosure, the frame 21 may be referred to as a housing or a housing structure forming an outer surface (or an external shape) of the wearable electronic device 2. For wearability, the frame 21 may be made of a material, such as a plastic (or a polymer), but may be made of various materials, such as a metal based on the strength or a beautiful shape thereof without limitation thereto. In some embodiments of the disclosure, the wearable electronic device 2 may be implemented in various types which can be worn on the head of a user while allowing the first transparent display 23 and the second transparent display 24 to be positioned in front of the eyes without being limited to the embodiment of FIG. 2. For example, the wearable electronic device may include various other structures, such as straps or helmets, and may be implemented to be wearable on a head.

According to an embodiment of the disclosure, the wearable electronic device 2 may be smartglasses (or smart glasses). For example, the wearable electronic device 2 may be wearable computer glasses that add visual information to what a wearer really sees, or provide an augmented reality adding visual information alongside what a wearer sees thereto. An AR can blend digital objects with the physical world. An AR can provide various image information by superimposing a virtual image on a real space or things. For example, in a mode relating to an AR, the wearable electronic device 2 may display an image (e.g., a virtual image) on the first transparent display 23 and/or the second transparent display 24, and a wearer may see the image on which a foreground (e.g., a real image) in front of the eyes is overlapped. In some embodiments of the disclosure, an AR may be referred to as a see-through function or a see-through mode. In order to provide an AR, an operation of superimposing visual information onto a field of view of a wearer may be variously implemented according to types of the first transparent display 23 and/or the second transparent display 24.

According to an embodiment of the disclosure, the first transparent display 23 and/or the second transparent display 24 may be a projection-type transparent display. For example, the first transparent display 23 may be a transparent plate (or a transparent screen) to form a reflective surface, and an image generated in the wearable electronic device 2 may be reflected (e.g., a total internal reflection (TIR)) on the reflective surface and then enter into the eyes (e.g., a proto type). In some embodiments of the disclosure, the first transparent display 23 may be an optical waveguide for transferring light generated in a light source positioned in the wearable electronic device 2 to the right eye of a wearer. For example, an optical waveguide may be made of a glass or a plastic (or a polymer), and may include a nanopattern (e.g., a grating structure having a polygon or a curved-surface shape) formed therein or on a surface thereof. The second transparent display 24 may be implemented in substantially the same manner as the first transparent display 23.

In an embodiment of the disclosure, the wearable electronic device 2 may include a first projector (or, a first light source) (not shown) for projecting light associated with an image to the first transparent display 23. The first transparent display 23 may be implemented in a transparent plate (or a transparent screen) which allows an image projected from the first projector to be displayed thereon while allowing a foreground in front of the eyes to be seen. In an embodiment of the disclosure, the wearable electronic device 2 may include a second projector (or, a second light source) (not shown) for projecting light associated with image to the second transparent display 24. The second transparent display 24 may be implemented in a transparent plate (or a transparent screen) which allows an image projected from the second projector to be displayed thereon while allowing a foreground in front of the eyes to be seen. The first project may be positioned on the first rim 211 or the first end piece 214, and the second project may be positioned on the second rim 212 or the second end piece 215. The first projector or the second projector may be positioned in various positions according to the shape of the wearable electronic device 2.

According to an embodiment of the disclosure, the first transparent display 23 and/or the second transparent display 24 may be a see-through type of transparent display. For example, a see-through type of transparent display may be various, such as a transparent organic light emitting diodes (OLED) display, a transparent micro LED, or a transparent liquid crystal display (LCD). For another example, a see-through type of transparent display may be implemented in a transparent thin-film electro-luminescence (TEEL) type. A TEEL type may include a transparent insulation film between a transparent electrode and a transparent inorganic phosphor by using a principle in which electrons quickly flow in a transparent inorganic phosphor while emitting light. For another example, a see-through type of transparent display may be a transparent display based on an element such an electroluminescent display (ELD), an electrochromic element, or an electrowetting element. A see-through type of transparent display may be implemented in various other types.

According to some embodiments of the disclosure, the first transparent display 23 and/or the second transparent display 24 may be a transparent near-eye-display (NED). In some embodiments of the disclosure, the first transparent display 23 and/or the second transparent display 24 may be implemented in an optical screen which allows a projected image to be clearly seen even in a bright environment.

According to some embodiments of the disclosure, the first transparent display 23 and/or the second transparent display 24 may be implemented in various types which display or include an augmented reality (AR) overlay.

According to some embodiments of the disclosure, the wearable electronic device 2 may be implemented in the form in which an image is directly projected on the retina. For example, the wearable electronic device 2 may include a first projector for directly projecting light onto the retina of the right eye, and in the case, the first transparent display 23 may be omitted. In some embodiments of the disclosure, a transparent plate, which plays a function allowing light to be transmitted between the first projector and the right eye, may be positioned instead of the first transparent display 23. For example, the wearable electronic device 2 may include a second projector for directly projecting light onto the retina of the left eye, and in the case, the second transparent display 24 may be omitted. In some embodiments of the disclosure, a transparent plate, which plays a function allowing light to be transmitted between the second projector and the left eye, may be positioned instead of the second transparent display 24.

According to some embodiments of the disclosure, the wearable electronic device 2, as smart glasses, may be defined to wearable computer glasses that are able to change their optical properties at runtime. For example, the wearable electronic device 2 may be implemented to change the tint of the first transparent display 23 and/or the second transparent display 24 by an electronic means.

According to some embodiments of the disclosure, the first transparent display 23 and the second transparent display 24 may be implemented in an integrated transparent display. For example, the integrated transparent display may include a first portion positioned on the first rim 211, a second portion positioned on the second rim 212, and a third portion which is positioned on the bridge 213 and connects the first portion and the second portion. In the case, the bridge 213 may be implemented in a different shape to correspond to the third portion.

According to some embodiments of the disclosure, the wearable electronic device 2 may be also implemented to provide a see-closed function. In the case, the first transparent display 23 and the second transparent display 24 may be replaced to a nontransparent type of display. In some cases, the wearable electronic device 2 may further include a cover attachable to the frame 21 when a see-closed function is used. When the cover is attached thereto, a foreground (e.g., a real image) through the first transparent display 23 and the second transparent display 24 may be closed. In a see-closed function, the wearable electronic device 2 may enable contents (e.g., a movie, streaming, broadcast, or game) provided through two screens in a state where the two screens are positioned in front of two eyes of a user, respectively, to be seen by the user. A see-closed function may provide an immersion to a user by using screens in which the first transparent display 23 and the second transparent display 24 are independent from each other. In some embodiments of the disclosure, the wearable electronic device 2 may include a camera, and may provide a see-through function by using the camera. A see-through function may enable image data obtained from the camera to be displayed on two screens. Through this, a wearer may experience an external virtual environment, and identify a peripheral environment through an image of the camera as necessary. In some embodiments of the disclosure, the wearable electronic device 2 may be implemented to have one screen extending from the right eye to the left eye. In the case, the wearable electronic device 2, in a see-closed function, may enable contents to be displayed through a first screen region positioned in front of the right eye and a second screen region positioned in front of the left eye of the one screen.

According to various embodiments of the disclosure, the wearable electronic device 2 may be implemented to provide a mixed reality (MR) (or a hybrid reality). A mixed reality (MR) may include an environment where a physical object of reality and a virtual object can interact by grafting a virtual reality (VR) onto the real world. A mixed reality (MR) may include a meaning of an AR adding virtual information based on reality thereto and an augmented virtuality (AV) adding real information to a virtual environment. An MR may provide a smart environment in which reality and virtuality are naturally connected, and thus a user may have a rich experience. For example, a user may interact with a virtual pet placed on the palm of the user, or may play a game by building a virtual game environment in a real room. For another example, in an MR, a user may virtually rearrange furniture in a home, or may build an environment in which as if remote people work together in a state of being gathered together.

According to some embodiments of the disclosure, the wearable electronic device 2 may include a lens assembly (not shown) including a first lens (e.g., an eyeglass lens or a corrective lens) positioned between the first transparent display 23 and the right eye of a wearer and a second lens positioned between the second transparent display 24 and the left eye of the wearer. The lens assembly may include a holder (or a lens support member) which is attachable to or detachable from the frame 21 and supports the first lens and the second lens. When the holder is attached to the frame 21, the first lens may face the first transparent display 23, and the second lens may be positioned to face the second transparent display 24. The first lens may be manufactured based on the visual acuity of the right eye of a wearer, and the second lens may be manufactured based on the visual acuity of the left eye of the wearer. In addition, the first lens and the second lens positioned in the holder may be manufactured based on an inter pupillary distance (IPD) (e.g., a distance of a line connecting the pupil centers of both eyes). The first lens may be manufactured such that the optical center point (e.g., a position through which light passes without bending) is aligned with the center of the pupil of the right eye, and the second lens may be manufactured such that the optical center point is aligned with the center of the pupil of the left eye. The distance between the optical center point of the first lens and the optical center of the second lens may be the same as the IPD. Therefore, visual discomfort of a wearer, such as blurring or dizziness, can be prevented. In some embodiments of the disclosure, in a state where the first transparent display 23 is implemented in a projective transparent display, a first projector (not shown) for projecting light into the first transparent display 23 may be at least partially positioned between the first transparent display 23 and the first lens. In a state where the second transparent display 24 is implemented in a projective transparent display, a second projector (not shown) for projecting light into the second transparent display 24 may be at least partially positioned between the second transparent display 24 and the second lens.

According to an embodiment of the disclosure, the wearable electronic device 2 may include a first camera module 201, multiple second camera modules 202, audio modules 203, 204, and 205, a first printed circuit board 206, a second printed circuit board 207, a first battery 208, or a second battery 209. For example, the wearable electronic device 2 may be the electronic device 101 of FIG. 1. In some embodiments of the disclosure, the wearable electronic device 2 may include at least some of elements included in the electronic device 101 of FIG. 1, or may be implemented by additionally including other elements. The position or shape of elements included in the wearable electronic device 2 may not be limited to the embodiment illustrated in FIG. 2, and may be various.

For example, the first camera module 201 and each of the multiple second camera modules 202 may include one lens or multiple lenses, an image sensor, and/or an image signal processor. In an embodiment of the disclosure, the first camera module 201 may be positioned at the bridge 213 to obtain image data for a foreground (e.g., real image) in front of the eyes. The position or number of the first camera module 201 may be not limited to the embodiment illustrated therein, and may be various. In an embodiment of the disclosure, the multiple second camera modules 202 may measure depth of field (DOF). The wearable electronic device 2 may perform various functions, such as a head tracking, a hand detection or tracking, a gesture recognition, or a spatial recognition by using the depth of field (e.g., 3DOF or 6DOF) obtained through the multiple second camera modules 202. For example, the multiple second camera modules 202 may include a global shutter (GS) camera or a rolling shutter (RS) camera, and the position or number thereof may not be limited to the embodiment illustrated therein and may be various.

According to an embodiment of the disclosure, the wearable electronic device 2 may include an eye tracking module. For example, an eye tracking module may track the gaze of a wearer by using at least one type of an electro-oculography (EOG) (or electrooculogram) sensor, a coil system, a dual Purkinje system, bright pupil systems, or dark pupil systems. For example, an eye tracking module may be positioned at the frame 21 (e.g., the first rim 211, the second rim 212, or the bridge 213), and may include at least one camera (e.g., a micro camera) for tracking the gaze of a wearer.

According to an embodiment of the disclosure, the wearable electronic device 2 may include at least one light-emitting element (not shown). For example, the light-emitting element may provide state information of the wearable electronic device 2 as a light form. For another example, the light-emitting element may provide a light source interworking with an operation of a camera module. For example, the light-emitting element may include, LED, IR LED, or xenon lamps.

For example, the audio modules 203, 204, and 205 may include a first audio module 203 for a microphone, a second audio module 204 for a first speaker, and a third audio module 205 for a second speaker. In an embodiment of the disclosure, the first audio module 203 may include a microphone hole formed through the bridge 213 of the frame 21 and a microphone positioned inside the bridge 213 to correspond to the microphone hole. The position or number of the first audio module 203 for a microphone may not be limited to the embodiment illustrated therein, and may be various. In some embodiments of the disclosure, the wearable electronic device 2 may detect the direction of sound by using multiple microphones. In an embodiment of the disclosure, the second audio module 204 may include a first speaker positioned inside the first temple 210, and the third audio module 205 may include a second speaker positioned inside the second temple 220. For example, the first speaker or the second speaker may be a piezo speaker (e.g., a bone conduction speaker) implemented without a speaker hole. The second audio module 204 for a first speaker or the third audio module 205 for a second speaker may be implemented in various other types.

According to an embodiment of the disclosure, the first printed circuit board 206 may be positioned inside the first temple 210, and the second printed circuit board 207 may be positioned inside the second temple 220. For example, the first printed circuit board 206 or the second printed circuit board 207 may include a printed circuit board (PCB), a flexible PCB (FPCB), or a rigid-flexible PCB (RFPCB). In some embodiments of the disclosure, the first printed circuit board 206 or the second printed circuit board 207 may include a main PCB, a slave PCB disposed to partially overlap the main PCB, and/or an interposer substrate between the main PCB and the slave PCB. For example, the first printed circuit board 206 or the second printed circuit board 207 may have various electronic components (e.g., at least some of elements included in the electronic device 101 of FIG. 1), such as a processor (e.g., the processor 120 of FIG. 1), a memory (e.g., the memory 130 of FIG. 1), a communication module (e.g., the communication module 190 of FIG. 1), or an interface (e.g., the interface 177 of FIG. 1), which are arranged thereon. The first printed circuit board 206 or the second printed circuit board 207 may be electrically connected to other elements by using an electrical route, such as a flexible printed circuit board and a cable positioned in the frame 21. In some embodiments of the disclosure, one of the first printed circuit board 206 and the second printed circuit board 207 may be omitted.

According to an embodiment of the disclosure, the first battery 208 may be positioned inside the first temple 210, and the second battery 209 may be positioned inside the second temple 220. The first battery 208 and the second battery 209 may be a device (e.g., the battery 189 of FIG. 1) for supplying power to elements of the electronic device 2, and for example, may include a non-rechargeable primary cell, a rechargeable secondary cell, or a fuel cell. In some embodiments of the disclosure, the wearable electronic device 2 may be implemented to allow the first battery 208 or the second battery 209 to be attached to or detached from the frame 21. In some embodiments of the disclosure, one of the first battery 208 and the second battery 209 may be omitted. The position of the battery may not be limited to the embodiment illustrated therein, and may be various.

According one embodiment of the disclosure, the wearable electronic device 2 may include a sensor module (e.g., the sensor module 176 of FIG. 1). The sensor module may generate electric signals or data values corresponding to an operation state inside or an environment state outside the wearable electronic device 2. For example, the sensor module may further include at least one of a gesture sensor, a gyro sensor, a barometric pressure sensor, a magnetic sensor, an acceleration sensor, a grip sensor, a color sensor, an infrared (IR) sensor, a biometric sensor (e.g., an HRM sensor), a temperature sensor, a humidity sensor, or an illuminance sensor. In some embodiments of the disclosure, the sensor module may recognize biometric information of a user by using various biometric sensors (or, a biometric recognition sensor), such as an e-nose sensor, an electromyography (EMG) sensor, an electroencephalogram (EEG) sensor, an electrocardiogram (ECG) sensor, or an iris sensor. In some embodiments of the disclosure, the sensor module may further include at least one control circuit for controlling at least one sensor included therein.

According an embodiment of the disclosure, the wearable electronic device 2 may include an input module (e.g., the input module 150 of FIG. 1). For example, the input module may include a touch pad or a button. For example, the touch pad may recognize a touch input through at least one method of an electrostatic method, a pressure sensitive method, an infrared method, or an ultrasonic method. The touch pad may further include a tactile layer, and may provide a tactile reaction to a user. For example, the button may include a physical button, an optical key, or a keypad. The input module may include various other types of user interfaces.

In some embodiments of the disclosure, the input module may include at least one sensor module.

According an embodiment of the disclosure, the wearable electronic device 2 may include a connection terminal (e.g., the connection terminal 178 of FIG. 1). The connection terminal may include a connector which enables the wearable electronic device 2 to be physically connected to an external electronic device (e.g., the external electronic device 102 of FIG. 1) therethrough.

Figure 3:
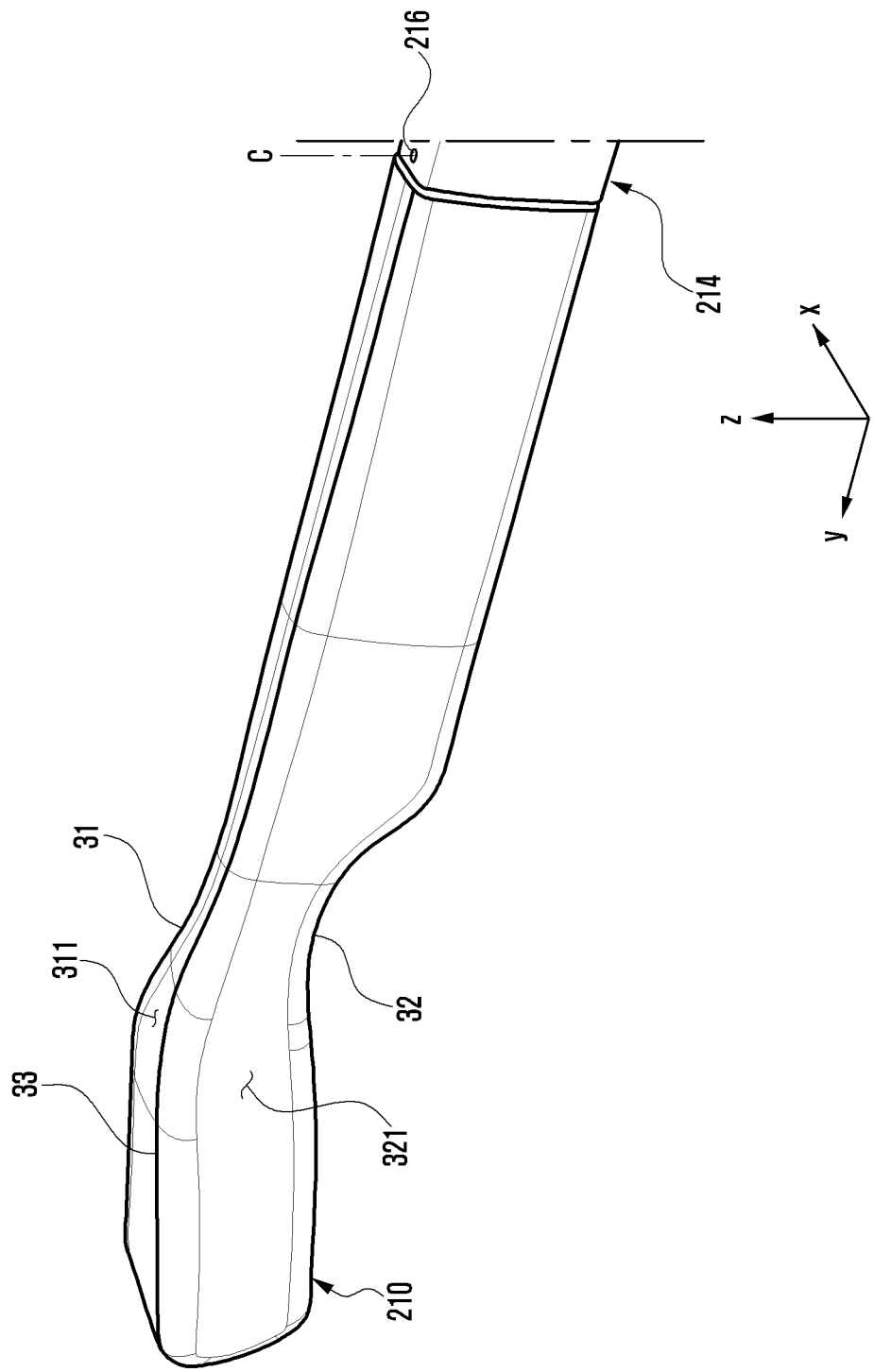
FIGS. 3, 4, and 5 are perspective views of parts of a wearable electronic device of FIG. 2 according to various embodiments of the disclosure.
Figure 4:
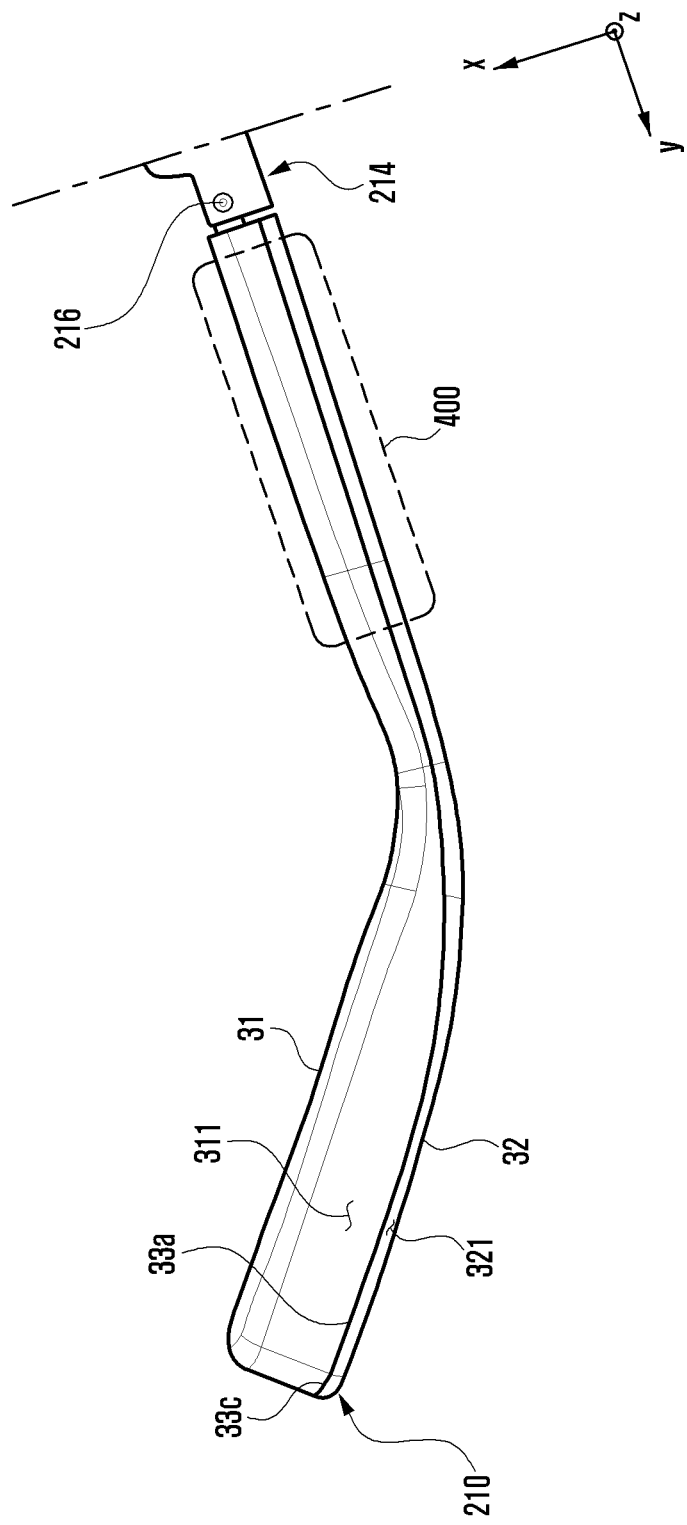
Figure 5:
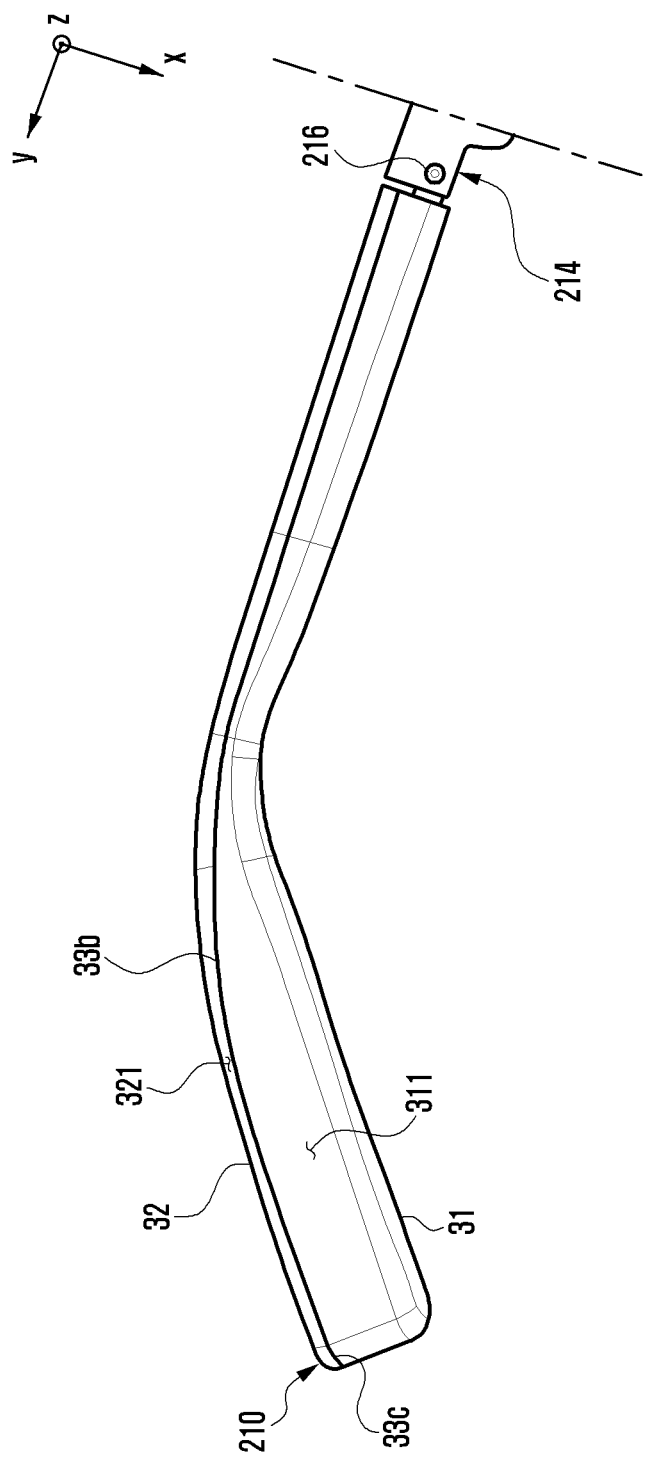

FIGS. 3, 4, and 5 are perspective views of parts of a wearable electronic device 2 of FIG. 2 according to various embodiments of the disclosure. FIGS. 3, 4, and 5 illustrate the first temple 210 and the first end piece 214 connected to each other by using the first hinge 216.

Figure 6:
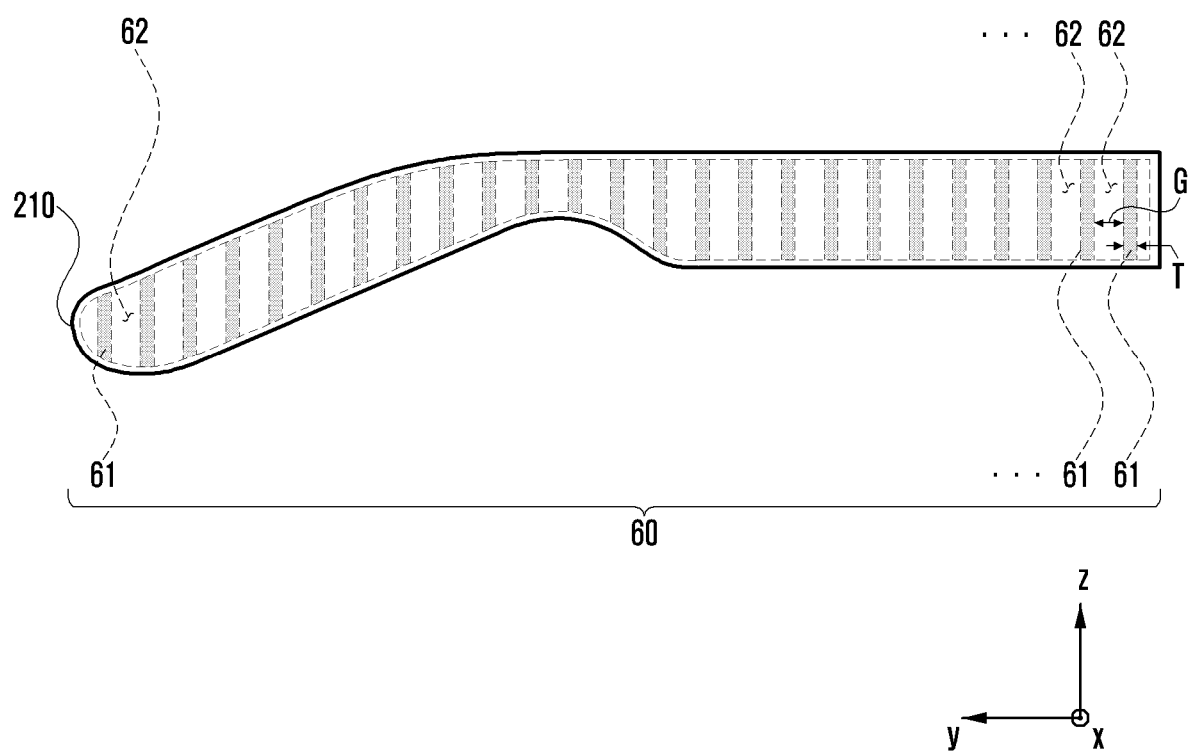
FIG. 6 illustrates a first temple seen toward an +x-axis direction in FIG. 3 according to an embodiment of the disclosure.

FIG. 6 illustrates a first temple seen toward a +x-axis direction in FIG. 3 according to an embodiment of the disclosure.

Referring to FIGS. 3 and 4, in an embodiment of the disclosure, the first temple 210 may include a first housing part 31 (or, a first frame or a first portion) and a second housing part 32 (or, a second frame or a second portion). The first housing part 31 and the second housing part 32 may be positioned opposite to each other. For example, in a state where the first temple 210 is folded with reference to the first hinge 216, the first housing part 31 may face the first transparent display 23 and the second transparent display 24. The first housing part 31 or the second housing part 32 may not be limited to the embodiment illustrated therein, and may be formed in various other shapes for forming an outer surface (or an external shape) of the first temple 210. The first temple 210 may not be limited to the embodiment illustrated therein, and may include housing parts greater than or equal to the number of the housing parts of the embodiment. The first temple 210 may include a boundary part 33 between the first housing part 31 and the second housing part 32. The boundary part 33 may at least partially extend along a surface boundary between a first outer surface 311 of the first temple 210 formed by the first housing part 31 and a second outer surface 321 of the first temple 210 formed by the second housing part 32.

Referring to FIGS. 3, 4, 5, and 6, in an embodiment of the disclosure, the first temple 210 may include a support part 60 positioned in a space between the first housing part 31 and the second housing part 32. For example, the support part 60 may be the other end included a shape bent from one end connected to the first end piece 214, the bent shape allowing same to be put on the right ear, and the other end may have a shape in which multiple support structures 61 are arranged. The support part 60 may be referred to as multiple support structures.

According to an embodiment of the disclosure, the support part 60 may contribute to durability or hardness of the first temple 210 so as to reduce damage of the first temple 210 (or, the first housing part 31 and/or the second housing part 32) in response to an impact or a load applied from the outside of the wearable electronic device 2. For example, an external impact or load is applied to the first housing part 31 or the second housing part 32, the support part 60 may perform a buffer function or softening function capable of reducing an influence (e.g., a stress influence) affecting the first housing part 31 or the second housing part 32.

According to an embodiment of the disclosure, the support part 60 may support at least one electronic component (e.g., the second audio module 204, the first printed circuit board 206, or the first battery 208 of FIG. 2) positioned inside the first temple 210. For example, in response to an external impact, the support part 60 may contribute such that at least one electronic component is stably positioned in the first temple 210 without a shaking or movement.

According to an embodiment of the disclosure, heat emitted from at least one electronic component (e.g., the second audio module 204, the first printed circuit board 206, or the first battery 208 of FIG. 2) positioned inside the first temple 210 may be emitted into an outer space of the first temple 210 through the boundary part 33 between the first housing part 31 and the second housing part 32. At least a part of the boundary part 33 may include at least one opening (or gap). Heat emitted from at least one electronic component positioned inside the first temple 210 may be emitted into an outer space of the first temple 210 through at least one opening included in the boundary part 33. For example, at least one opening included in the boundary part 33 may be formed in various shapes, such as a slit or a hole. In some embodiments of the disclosure, a coupling part, which does not have a gap formed between the first housing part 31 and the second housing part 32, may be positioned in a portion (a section) other than at least one opening of the boundary part 33. For example, the coupling part between the first housing part 31 and the second housing part 32 may be formed using various types, such as a bolt fastening, a snap-fits fastening, or an adhesive member.

For example, the boundary part 33 may include a first boundary part 33a, a second boundary part 33b, and a third boundary part 33c. The first boundary part 33a and the second boundary part 33b may be spaced apart from each other in the direction (e.g., the z-axis direction) of a rotation axis C of the first hinge 216. The third boundary part 33c may connect the first boundary part 33a and the second boundary part 33b, and for example, may be positioned at end of a bent portion, which can be put on the right ear, of the first temple 210. In a state where the wearable electronic device 2 of FIG. 2 is worn on a user, in order that heat is emitted from the inside of the first temple 210 to the outside of the first temple 210, at least one opening positioned in at least a part of the first boundary part 33a, the second boundary part 33b, or the third boundary part 33c may not be substantially covered by the body of a wearer. It may contribute that heat emitted from at least one electronic component positioned inside the first temple 210 is smoothly emitted into an outer space of the first temple 210 through at least one opening included in the boundary part 33, and thus may reduce an influence (e.g., displeasure or burning) affecting a wearer.

According to an embodiment of the disclosure, the support part 60 may perform a function of a heat dissipation structure (e.g., a heat movement route or a heat movement path) which contributes such that heat emitted from at least one electronic component positioned inside the first temple 210 is transferred to at least one opening included in the boundary part 33 between the first housing part 31 and the second housing part 32. The support part 60 may include a distancing space 62 (e.g., a slit) between the support structures neighbor to each other. At least one distancing space 62 included in the support part 60 may be positioned to correspond to at least one electronic component emitting heat, and may perform a function of a heat movement route (or a heat movement path) which contributes such that heat emitted from at least one electronic component is moved to at least one opening included in the boundary part 33. For example, by using the support part 60, at least one heat movement route formed in the first temple 210 may become a channel which allows air to flow (or move) from a high-temperature part (e.g., at least one electronic component emitting heat) to a low-temperature part (e.g., an outer space of the first temple 210) by convection heat transfer (e.g., a manner of energy transfer between a solid surface and gas). By using the support part 60, at least one heat movement route formed in the first temple 210 may efficiently emit heat emitted from at least one electronic component into an outer space of the first temple 210 through the boundary part 33 while preventing the heat from being stayed in the inner space of the first temple 210, so as to improve heat dissipation efficiency.

According to some embodiments of the disclosure, a part of the support part 60 may have a first thermal conductivity, and a part of another part of the support part 60 may have a second thermal conductivity different from the first thermal conductivity.

According to some embodiments of the disclosure, at least a part of the support part 60 may made of a first material having a first thermal conductivity, and a surface included in at least a part of the support part 60 may have a second material having a second thermal conductivity different from the first thermal conductivity, which is disposed or coated thereon. In some embodiments of the disclosure, the second material having the second thermal conductivity may contribute to insulation.

According to some embodiments of the disclosure, at least a part of the support part 60 may include a first portion which has a first thermal conductivity and forms a surface of the support part 60, and a second portion which is at least partially positioned inside of the first portion and has a second thermal conductivity different from the first thermal conductivity.

According to some embodiments of the disclosure, at least a part of the support part 60 may function as a heat dissipation structure (e.g., a heat spreader) for dispersing or diffusing heat. At least a part of the support part 60 may include various heat conductive materials (e.g., a heat transfer material). Heat conducted from at least one electronic component to the support part 60, by a convection heat transfer, may be emitted from the support part 60 into an outer space of the first temple 210 through the boundary part 33 between the first housing part 31 and the second housing part 32.

According to an embodiment of the disclosure, at least one support structure 61 included in the support part 60 may extend in a direction (e.g., the direction of the rotation-axis C of the first hinge 216) from the first boundary part 33a toward the second boundary part 33b. At least a part (or at least partial section) of the first boundary part 33a may include at least one first opening corresponding to at least one heat movement route formed in the first temple 210 by using the support part 60. At least a part (or at least partial section) of the second boundary part 33b may include at least one second opening corresponding to at least one heat movement route formed in the first temple 210 by using the support part 60. The shape or number of the support structure 61 included in the support part 60 and the shape of the distancing space 62 (e.g., slit) corresponding thereto may not be limited to the embodiment illustrated therein, and may be various. For example, at least one support structure 61 included in the support part 60 may extend not to be parallel to the direction of the rotation-axis C the first hinge 216. For another example, two support structures neighbor to each other included in the support part 60 may extend not to be parallel to each other. For another example, at least one support structure 61 included in the support part 60 may be variously formed as a bent shape or a curved shape.

According to an embodiment of the disclosure, a gap (e.g., refer to reference numeral 'G') between the support structures neighbor to each other included in the support part 60 may be uniform in at least partial section of the first temple 210. In some embodiments of the disclosure, a first gap between at least two first support structures of the support part 60, which are positioned in a first section of the first temple 210, may be different from a second gap between at least two second support structures of the support part 60, which are positioned in a second section of the first temple 210. For example, at least two first support structures positioned in the first section of the first temple 210 may function as a heat dissipation structure (e.g., a first heat movement route) for heat emitted from a first electronic component. At least two second support structures positioned in the second section of the first temple 210 may function as a heat dissipation structure (e.g., a second heat movement route) for heat emitted from a second electronic component. A first gap between at least two first support structures may be formed to secure a heat dissipation efficiency for a first electronic component (e.g., to prevent overheating of a first electronic component) based on the temperature or amount of heat emitted from a first electronic component. A second gap between at least two second support structures may be formed to secure a heat dissipation efficiency for a second electronic component (e.g., to prevent overheating of a second electronic component) based on the temperature or amount of heat emitted from a second electronic component.

According to an embodiment of the disclosure, the thickness (e.g., refer to reference numeral 'T') of at least one support structure 61 included in the support part 60 may be uniform in at least partial section of the first temple 210. In some embodiments of the disclosure, a first thickness of at least one first support structure of the support part 60, which are positioned in the first section of the first temple 210, may be different from a second thickness of at least second support structure of the support part 60, which are positioned in the second section of the first temple 210. The first thickness of at least one first support structure may be formed to secure a heat dissipation efficiency for a first electronic component (e.g., to prevent overheating of a first electronic component) based on the temperature or amount of heat emitted from a first electronic component. The second thickness of at least one second support structure may be formed to secure a heat dissipation efficiency for a second electronic component (e.g., to prevent overheating of a second electronic component) based on the temperature or amount of heat emitted from a second electronic component.

According to an embodiment of the disclosure, the first housing part 31 and/or the second housing part 32 may be implemented to reduce that heat emitted from at least one electronic component positioned in the first temple 210 is conducted or moved to the first housing part 31 and/or the second housing part 32. It may reduce an influence (e.g., displeasure or burning) that heat emitted from at least one electronic component affects a wearer. For example, the first housing part 31 and/or the second housing part 32 may include a material (e.g., a polymer) having a heat conductivity, which can reduce that heat emitted from at least one electronic component positioned in the first temple 210 is transferred onto a surface (e.g., the first outer surface 311 and the second outer surface 321). In some embodiments of the disclosure, a housing part (e.g., the first housing part 31 and/or the second housing part 32) may include a first material (e.g., a metal material) having a first heat conductivity, and a surface (e.g., the first outer surface 311 and the second outer surface 321) of the housing part may have a second material disposed or coated (e.g., an insulation coating) thereon, which can reduce the degree of heat conduction and has a second thermal conductivity smaller than the first thermal conductivity. In the case, the first material may perform a function for dispersing or diffusing heat, and thus a heat dissipation efficiency can be improved. In some embodiments of the disclosure, a material capable of reducing the degree of heat conduction may be positioned between the support part 60 and the housing part (e.g., the first housing part 31 and/or the second housing part 32), and in order to reduce the degree of heat conduction therebetween, it may be implemented by reducing a contact area between the support part 60 and the housing part.

Although not illustrated therein, a heat dissipation structure for at least one electronic component (e.g., the third audio module 205, the second printed circuit board 207, or the second battery 209) included in the second temple 220 of FIG. 2 may be implemented in substantially the same manner as the heat dissipation structure for at least one electronic component included in the first temple 210.

Figure 7:
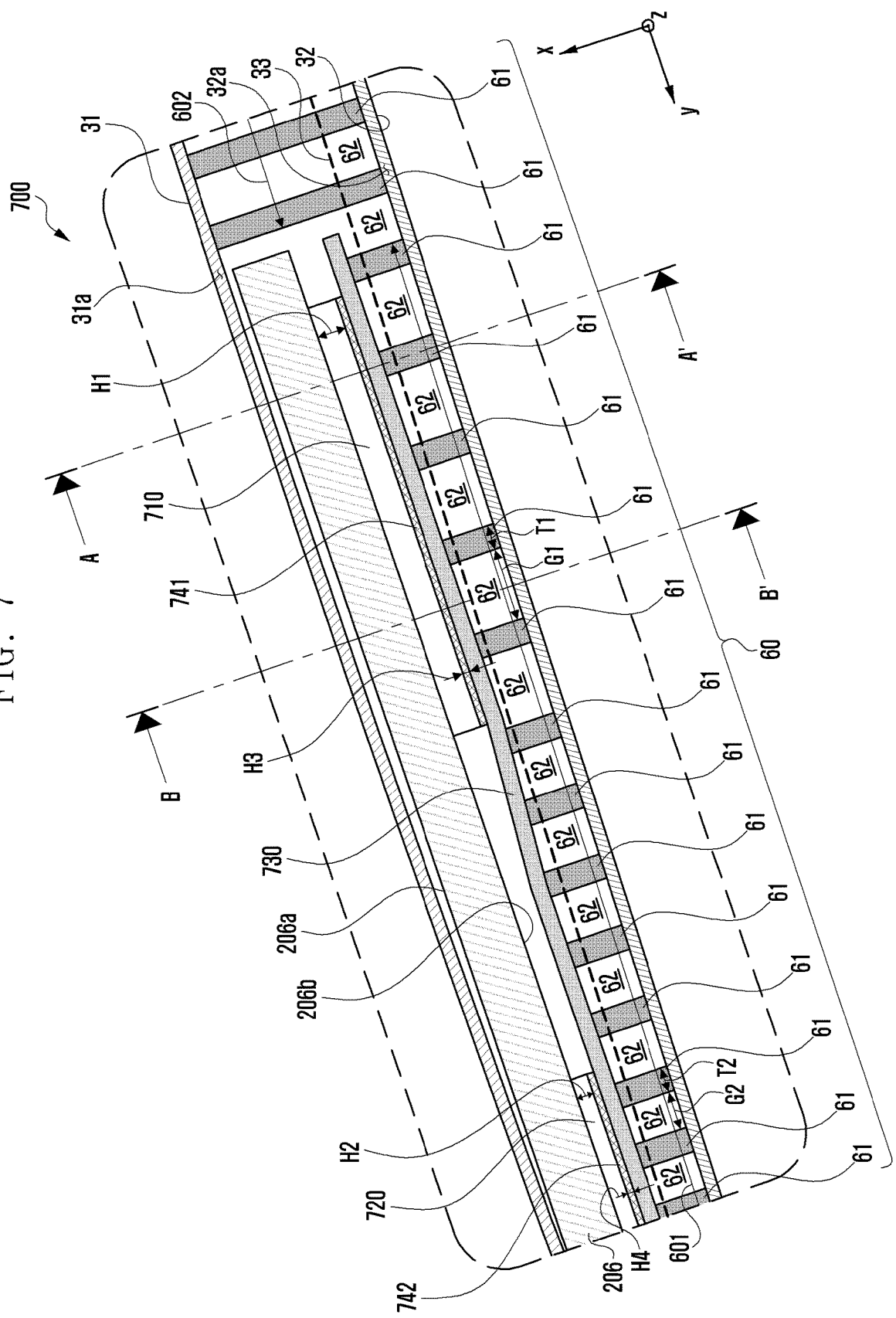
FIG. 7 illustrates a cross sectional structure of a part of a first temple illustrated in FIG. 4 according to an embodiment of the disclosure.

FIG. 7 illustrates a cross sectional structure 700 of a part of a first temple 210 illustrated in FIG. 4 according to an embodiment of the disclosure.

Figure 8:
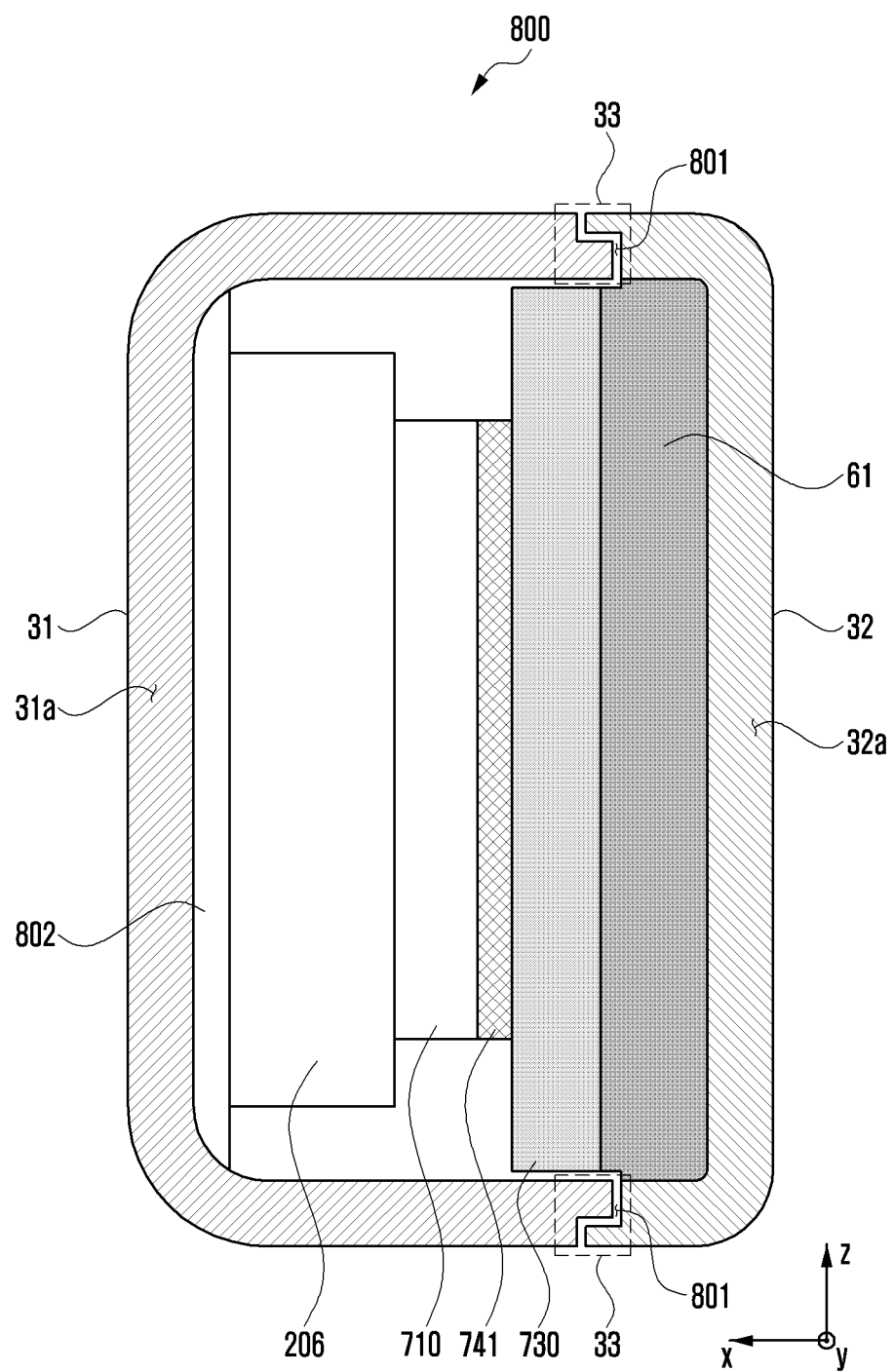
FIG. 8 illustrates a cross sectional structure taken along line A-A' of FIG. 7 according to an embodiment of the disclosure.

FIG. 8 illustrates a cross sectional structure 800 taken along line A-A' of FIG. 7 according to an embodiment of the disclosure.

Figure 9:
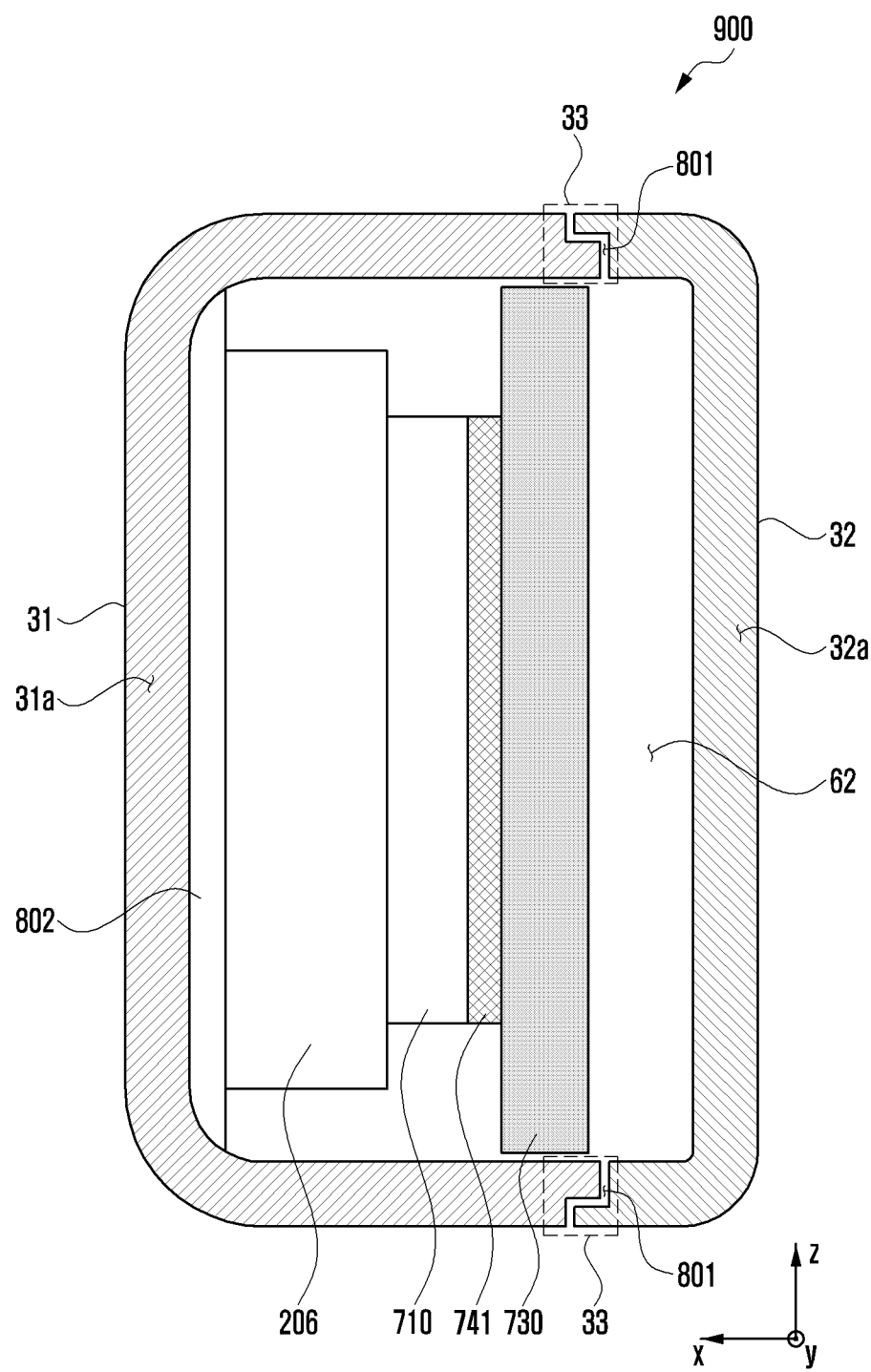
FIG. 9 illustrates a cross sectional structure taken along line B-B' of FIG. 7 according to an embodiment of the disclosure.

FIG. 9 illustrates a cross sectional structure 900 taken along line B-B' of FIG. 7 according to an embodiment of the disclosure.

Figure 10:
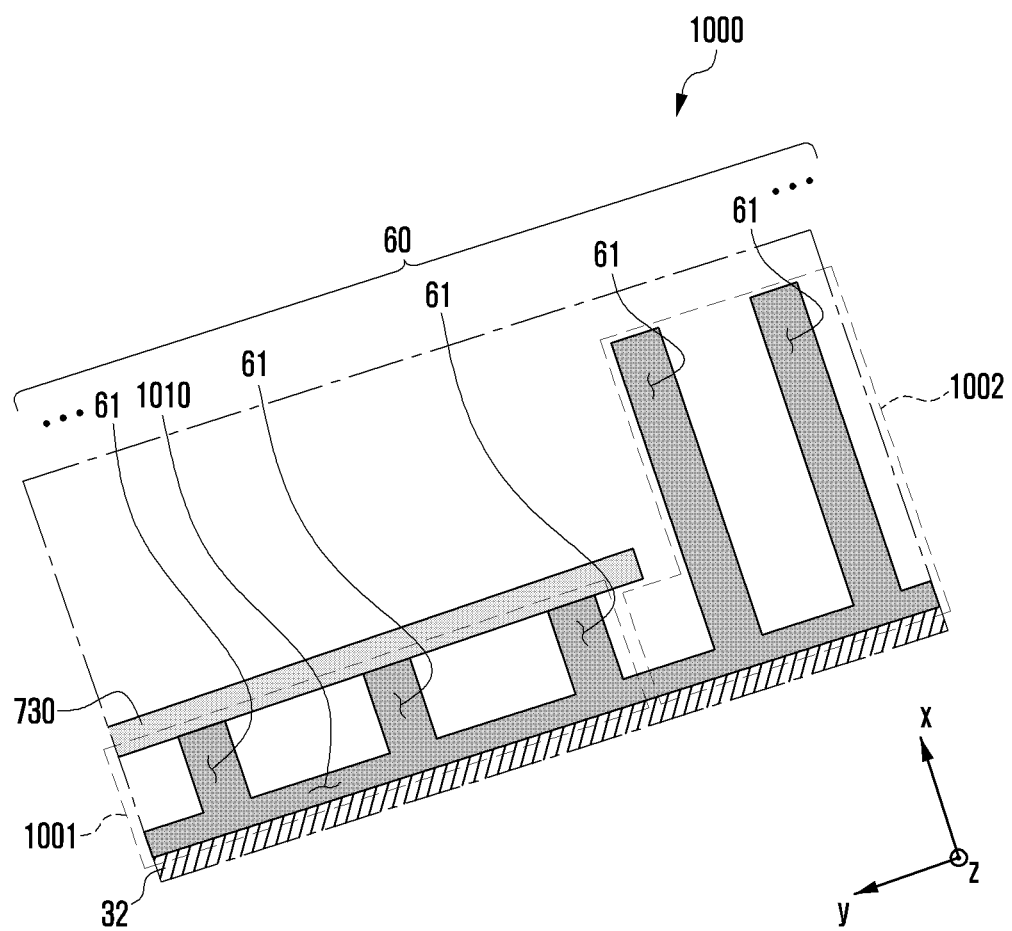
FIG. 10 illustrates a cross sectional structure of a portion of a wearable electronic device according to an embodiment of the disclosure.

FIG. 10 illustrates a cross sectional structure 1000 of a portion of a wearable electronic device (e.g., the wearable electronic device 2 of FIG. 2) according to an embodiment according to an embodiment of the disclosure. For example, FIG. 10 illustrates a cross sectional structure 1000 including the second housing part 32, the support part 60, and a heat conductive member 730.

Referring to FIGS. 7, 8, and 9, for example, a cross sectional structure 700 may include the first housing part 31, the second housing part 32, the first printed circuit board 206, a heat conductive member 730, a first heat transfer material 741, a second heat transfer material 742, or the support part 60 (or multiple support structures).

According to an embodiment of the disclosure, the first printed circuit board 206 may have at least one electronic component (e.g., a first electronic component 710 and a second electronic component 720) disposed thereon. The first housing part 31 may include a first region 31a, and the second housing part 32 may include a second region 32a positioned in a side opposite to the first region 31a. The first printed circuit board 206 may include a first surface 206a facing the first region 31a and a second surface 206b facing the second region 32a. A first electronic component 710 and a second electronic component 720 may be arranged on the second surface 206b. The first electronic component 710 and the second electronic component 720 may include a resistance component, and when the current is consumed, a part of the current may be converted into a thermal energy due to the resistance component and then emitted. The first electronic component 710 and the second electronic component 720 may be different from an electronic component provided to intentionally emit heat.

According to an embodiment of the disclosure, the heat conductive member 730 may be positioned between the first electronic component 710 and the support part 60 and between the second electronic component 720 and the support part 60. The first electronic component 710 and the second electronic component 720 may be arranged to be spaced apart from each other, and for example, the heat conductive member 730 may be integrally formed to correspond to at least a part of the first electronic component 710 and at least a part of the second electronic component 720. Heat emitted from the first electronic component 710 and heat emitted from the second electronic component 720 may be moved (or conducted) to the heat conductive member 730, and may be dispersed or diffused in the heat conductive member 730. For example, the heat conductive member 730 may include a heat dissipation member, such as a heat spreader or a heat sink, and may prevent overheating of the first electronic component 710 of the second electronic component 720. In an embodiment of the disclosure, a first height H1 in which the first electronic component 710 protrudes from the second surface 206b of the first printed circuit board 206 may be different from a second height H2 in which the second electronic component 720 protrudes from the second surface 206b of the first printed circuit board 206. The heat conductive member 730 may extend to overlap at least a part of the first electronic component 710 and at least a part of the second electronic component 720 based on the difference between the first height H1 and the second height H2. The heat conductive member 730 may not be limited to the embodiment illustrated therein, and may be formed in various other shapes. In some embodiments of the disclosure, a first heat conductive member corresponding to the first electronic component 710 and a second heat conductive member which corresponds to the second electronic component 720 and is separated from the first heat conductive member may be positioned in the first temple 210.

According to an embodiment of the disclosure, the first heat transfer material 741 may be positioned between the first electronic component 710 and the heat conductive member 730. The first heat transfer material 741 may be configured to improve a heat transfer efficiency when heat emitted from the first electronic component 710 is moved (e.g., conduction) to the heat conductive member 730. The second heat transfer material 742 may be positioned between the second electronic component 720 and the heat conductive member 730. The second heat transfer material 742 may be configured to improve a heat transfer efficiency when heat emitted from the second electronic component 720 is moved (e.g., conduction) to the heat conductive member 730. For example, the first heat transfer material 741 or the second heat transfer material 742 may include various thermal interface materials (TMI). In some embodiments of the disclosure, the first heat transfer material 741 or the second heat transfer material 742 may include various phase change materials (PCM). In some embodiments of the disclosure, a third height H3 of the first heat transfer material 741 and a fourth height H4 of the second heat transfer material 742 may be different. For example, based on the difference between the first height H1 of the first electronic component 710 and the second height H2 of the second electronic component 720, the sum of the first height H1 of the first electronic component 710 and the third height H3 of the first heat transfer material 741 may be substantially the same as the sum the second height H2 of the second electronic component 720 and the fourth height H4 of the second heat transfer material 742. In various embodiments of the disclosure, the first height H1, the second height H2, the third height H3, or the fourth height H4 may be various.

According to an embodiment of the disclosure, a part 601 of the support part 60 may be positioned between the heat conductive member 730 and the second housing part 32. The part 601 of the support part 60 may contribute such that the heat conductive member 730 and the first printed circuit board 206 on which at least one electronic component (e.g., the first electronic component 710 and the second electronic component 720) is arranged, are stably positioned between the first housing part 31 and the second housing part 32 without a shaking. In some embodiments of the disclosure, the first temple 210 may include a support member 802 positioned between at least one electronic component (e.g., the first electronic component 710 and the second electronic component 720) and the first housing part 31, and the support member 802 may be connected to the first housing part 31 or may be integrally formed with the first housing part 31. In some embodiments of the disclosure, the support member 802 may be formed in substantially the same structure as the support part 60 so as to contribute to a heat dissipation structure thereof. In an embodiment of the disclosure, the other part 602 of the support part 60 may be connected to the first housing part 31 or the second housing part 32, or may be integrally formed with the first housing part 31 and the second housing part 32 so as to support the first housing part 31 and the second housing part 32.

According to an embodiment of the disclosure, the part 601 of the support part 60, which is positioned to correspond to the heat conductive member 730, may contribute such that heat emitted from the first electronic component 710 and heat emitted from the second electronic component 720 move into at least one opening 801 included in the boundary part 33 between the first housing part 31 and the second housing part 32. One or more heat movement routes may be formed between the heat conductive member 730 and the second housing part 32 due to the at least one distancing space 62 between the support structures neighbor to each other included in the support part 60. The one or more heat movement routes may contribute such that heat moved (e.g., conduction) from the first electronic component 710 and the second electronic component 720 to the heat conductive member 730 is moved into the at least one opening 801 included in the boundary part 33 between the first housing part 31 and the second housing part 32 by a convection heat transfer.

According to an embodiment of the disclosure, at least a part (e.g., the portion indicated by reference numeral '601') of the support part 60 and the heat conductive member 730 may be integrally formed, and may include the same heat conductive material (or heat transfer material) (e.g., a metal material). In the case, at least a part of the support part 60 may perform a function of a heat spreader or a heat sink capable of dispersing or diffusing heat. In some embodiments of the disclosure, a heat transfer material, such as a TIM or a phase change material may be positioned between at least a part (e.g., the portion indicated by reference numeral '601') of the support part 60 and the heat conductive member 730. In some embodiments of the disclosure, at least a part of the support part 60 may include a heat conductive material different from the heat conductive member 730, or may have a heat conductivity different from that of the heat conductive member 730. In some embodiments of the disclosure, an adhesive heat conductive material may be positioned between at least a part (e.g., the portion indicated by reference numeral '601') of the support part 60 and the heat conductive member 730, to allow the support part 60 and the heat conductive member 730 to be coupled to each other.

According to some embodiments of the disclosure, the heat conductive member 730 may include a metal material, and at least a part of the support part 60 may include a nonmetal material (e.g., a polymer). An adhesive material may be positioned between at least a part (e.g., the portion indicated by reference numeral '601') of the support part 60 and the heat conductive member 730. In the case, at least a part of the support part 60 may be connected to the second housing part 32 or may be integrally formed with the second housing part 32, and may include the same material as that of the second housing part 32. For example, referring to FIG. 10, the support part 60 may include a fixing structure 1010 coupled to face the second housing part 32. The fixing structure 1010 may be a structure for connecting the support part 60 and the second housing part 30 in order to couple the support part 60 to the second housing part 32. The support structure 61 may be a form of protruding and extending from the fixing structure 1010, and may be integrally formed with the fixing structure 1010. In an embodiment of the disclosure, the support part 60 including the fixing structure 1010 may be integrally formed with the heat conductive member 730. An adhesive material made of various polymers may be positioned between the fixing structure 1010 and the second housing part 32. In some embodiments of the disclosure, the fixing structure 1010 and the second housing part 32 may be coupled to each other in a mechanical fastening method, such as a bolt fastening. In some embodiments of the disclosure, the fixing structure 1010 and the second housing part 32 may be coupled to each other in a method, such as a dovetail joint or snap-fits. In some embodiments of the disclosure, the second housing part 32 may be implemented in a form integrated with the support part 60 by using an insert injection molding. In some embodiments of the disclosure, the support part 60 may be implemented in multiple portions separated from each other. For example, the support part 60 may include a first section 1001 corresponding to a portion indicated by reference numeral '601' of FIG. 7 and a second section 1002 corresponding to a portion indicated by reference numeral '602' of FIG. 7, and the first section 1001 and the second section 1002 may be separated. In addition thereto, the support part 60 may include multiple portions separated in various forms. In some embodiments of the disclosure, one portion of the support part 60 may be positioned in the first housing part 31 by using the fixing structure 1010 according to the embodiment of FIG. 10, and the other portion of the support part 60 may be positioned in the second housing part 32 by using the fixing structure 1010 according to the embodiment of FIG. 10.

According to an embodiment of the disclosure, a first gap (e.g., refer to reference numeral 'G1') between at least two first support structures corresponding to the first electronic component 710 of the support part 60 may be different from a second gap (e.g., refer to reference numeral 'G2') between at least two second support structures corresponding to the second electronic component 720 of the support part 60. The first gap G1 may be formed to secure a heat dissipation efficiency for the first electronic component 710 based on the temperature or amount of heat emitted from the first electronic component 710, and the second gap G2 may be formed to secure a heat dissipation efficiency for the second electronic component 720 based on the temperature or amount of heat emitted from the second electronic component 720. For example, the heat emitted from the first electronic component 710 may have a temperature higher or an amount greater than the heat emitted from the second electronic component 720. In an embodiment of the disclosure, the first electronic component 710 may be a processor (e.g., the processor 120 of FIG. 1). The second electronic component 720 may be various, such as a power management module (e.g., the power management module 188 of FIG. 1) or a communication module (e.g., the communication module 190 of FIG. 1). The first gap G1 may be greater than the second gap G2, or in some cases, may be smaller than or substantially the same as the second gap G2. The first electronic component 710 or the second electronic component 720 may be arranged differently from the illustrated embodiment. The gap between the support structures included in the support part 60 may be variously formed based on a thermal analysis (or a heat dissipation analysis).

According to an embodiment of the disclosure, a first thickness (e.g., refer to reference numeral 'T1') of at least one support structure 61 corresponding to the first electronic component 710 of the support part 60 may be different from a second thickness (e.g., refer to reference numeral 'T2') of at least one first support structure 61 corresponding to the second electronic component 720 of the support part 60. The first thickness T1 may be formed to secure a heat dissipation efficiency for the first electronic component 710 based on the temperature or amount of heat emitted from the first electronic component 710, and the second thickness T2 may be formed to secure a heat dissipation efficiency for the second electronic component 720 based on the temperature or amount of heat emitted from the second electronic component 720. For example, the first thickness T1 may be greater than the second thickness T2, or in some cases, may be smaller than or substantially the same as the second thickness T2. The thickness of at least one support structure 61 included in the support part 60 may be variously formed based on a thermal analysis (or a heat dissipation analysis).

According to an embodiment of the disclosure, the at least one opening 801 included in the boundary part 33 between the first housing part 31 and the second housing part 32 may be implemented to prevent elements positioned in an inner space of the first temple 210 from being seen from the outside. For example, surfaces in which the first housing part 31 and the second housing part 32 face to each other on the boundary part 33 may be arranged while having a spaced distance, and may be formed in a form which prevents elements positioned in an inner space of the first temple 210 from being seen through the opening 801.

According to some embodiments of the disclosure, by using the support part 60, at least one opening, which allows heat to be emitted from at least one heat movement route formed in the first temple 210 to the outside of the first temple 210, may not be limited to the boundary part 33 between the first housing part 31 and the second housing part 32, and may be formed in various other positions of the first housing part 31 or the second housing part 32. At least one opening may be implemented to prevent elements positioned in an inner space of the first temple 210 from being seen from the outside. According to some embodiments of the disclosure, the support part 60 may not be limited to the illustrated embodiment of the disclosure, and may be positioned between at least one electronic component and the first housing part 31 so as to perform a function for supporting at least one electronic component and contribute to a heat dissipation structure.

Although not illustrated therein, a heat dissipation structure for the first battery 208 positioned in the first temple 210 may be implemented in substantially the same manner as the heat dissipation structure according to the embodiment of FIGS. 7, 8, and 9. For example, the heat conductive member 730 and the support part 60 may be positioned to corresponded to the first battery 208.

Although not illustrated therein, a heat dissipation structure for at least one electronic component (e.g., the third audio module 205, the second printed circuit board 207, or the second battery 209) included in the second temple 220 of FIG. 2 may be implemented in substantially the same manner as the heat dissipation structure according to the embodiment of FIGS. 7, 8, and 9.

Figure 11:
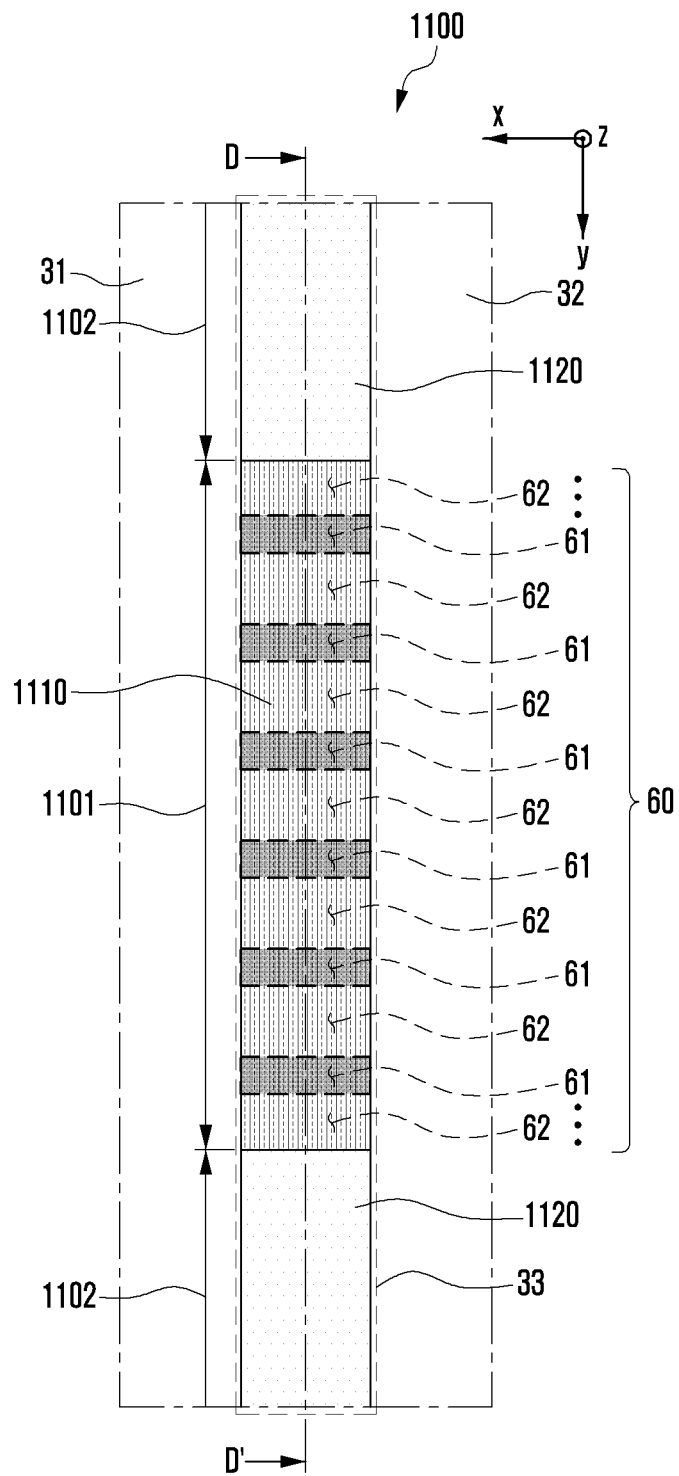
FIG. 11 is a plan view of a portion indicated by referential numeral '400' in the embodiment of FIG. 4 according to an embodiment of the disclosure.

FIG. 11 is a plan view 1100 of a portion indicated by referential numeral '400' in the embodiment of FIG. 4 according to an embodiment of the disclosure.

Figure 12:
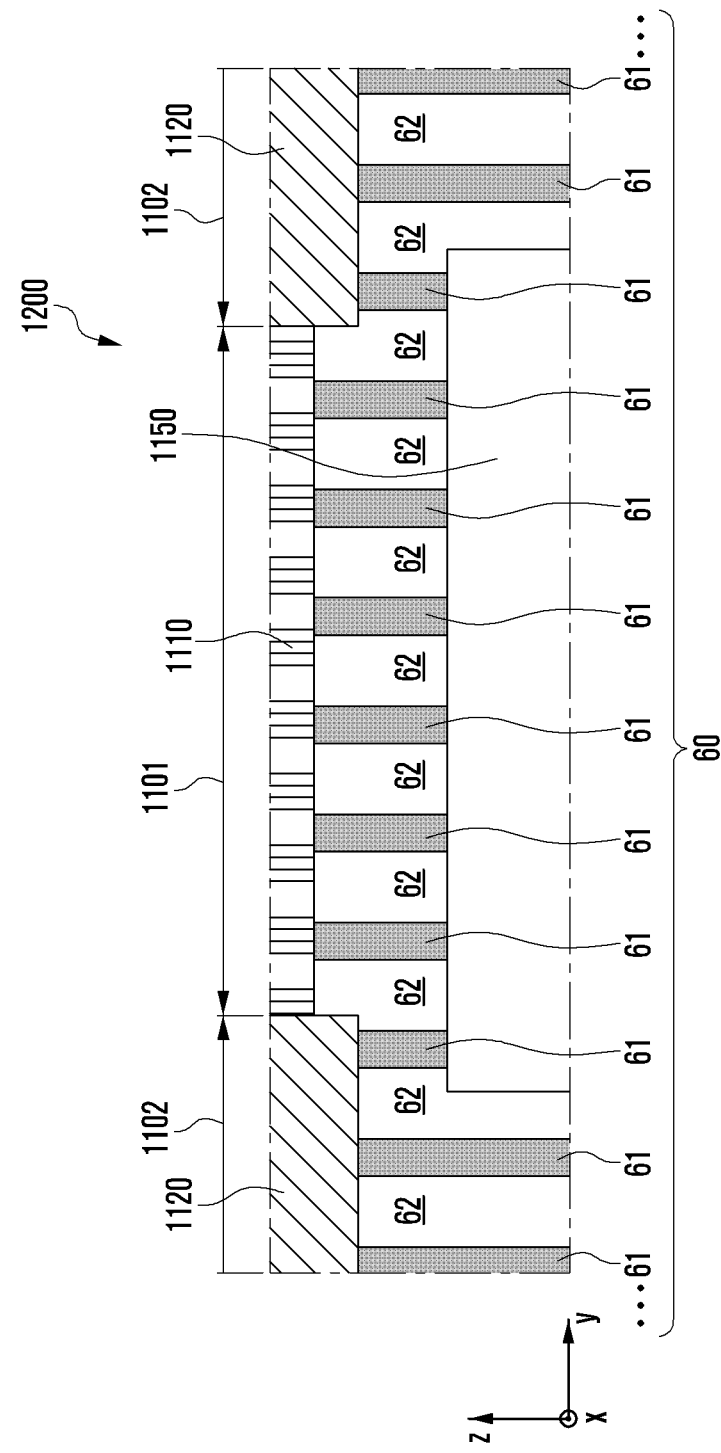
FIG. 12 illustrates a cross sectional structure taken along line D-D' of FIG. 11 according to an embodiment of the disclosure.

FIG. 12, for example, illustrates a cross sectional structure 1200 taken along line D-D' of FIG. 11 according to an embodiment of the disclosure.

Referring to FIGS. 11 and 12, the boundary part 33 between the first housing part 31 and the second housing part 32 may include an opening 1101 (e.g., the at least one opening 801 of FIG. 8) and a coupling part 1102. The opening 1101 may be positioned to overlap or align with an electronic component 1150 (e.g., the first electronic component 710 or the second electronic component 720 of FIG. 7) emitting heat. The support part 60 may perform a function of a heat dissipation function (e.g., a heat movement route or a heat movement path) which contributes such that heat emitted from the electronic component 1150 moves into the opening 1101 included in the boundary part 33. The support part 60 may include a distancing space 62 (e.g., a slit) between the support structures neighbor to each other. At least one distancing space 62 included in the support part 60 may be positioned to correspond to the electronic component 1150, and may be configured to communicate with an outer space through the opening 1101 of the boundary part 33. At least one distancing space 62 which is included in the support part 60 to corresponding to the opening 1101 of the boundary part 33, may perform a function of a heat movement route (or a heat movement path) which contributes such that heat emitted from the electronic component 1150 moves into the opening 1101 of the boundary part 33. The coupling part 1102 of the boundary part 33 may be a portion in which a gap is not formed between the first housing part 31 and the second housing part 32, and for example, may include an adhesive member 1120 positioned between the first housing part 31 and the second housing part 32. The adhesive member 1120 may be prevent external foreign substances, such as a dust or water from being introduced inside the first temple 210, and for example, may include various seal members. In some embodiments of the disclosure, a seal member (e.g., a flexible member or an elastic member) having substantially no adhesive component may be positioned in the coupling part 1102 instead of the adhesive member 1120, and in the case, a stable and sturdy coupling structure between the first housing part 31 and the second housing part 32 may be implemented in a position other than the coupling part 1102.

According to an embodiment of the disclosure, a cover member 1110 may be positioned in the opening 1101 of the boundary part 33. The cover member 1110 may prevent the inside (e.g., the support part 60 and the electronic component 1150) of the first temple 210 from being substantially seen through the opening 1101. The cover member 1110 may be prevent external foreign substances, such as a dust or water from being introduced inside the first temple 210. The cover member 1110 may be implemented in a material or a structure that does not degrade a performance in which heat is emitted from a heat movement route formed by the support part 60 to the outer space of the first temple 210, the opening 1101 and the electronic component 1150. For example, the cover member 1110 may include various porous members. For another example, the cover member 1110 may include a mesh structure.

According to an embodiment of the disclosure, at least one support structure 61 positioned to correspond to the opening 1101 of the boundary part 33 of the support part 60 may be in contact with the cover member 1110, and may support the cover member 1110. The cover member 1110 may be supported by at least one support structure 61 to be stably and sturdily positioned in the opening 1101 of the boundary part 33. In some embodiments of the disclosure, a seating part on which the cover member 1110 is seated may be formed at an edge of the opening 1101.

According to an embodiment of the disclosure, the thickness of the cover member 1110 may be thinner compared to the opening 1101, and at least one support structure 61 positioned to correspond to the opening 1101 of the boundary part 33 of the support part 60 may be partially inserted in the space of the opening 1101 to support the cover member 1110. According to the thickness of the cover member 1110, at least one support structure 61 positioned to correspond to the opening 1101 of the boundary part 33 of the support part 60 may not be inserted in the space of the opening 1101.

Figure 13:
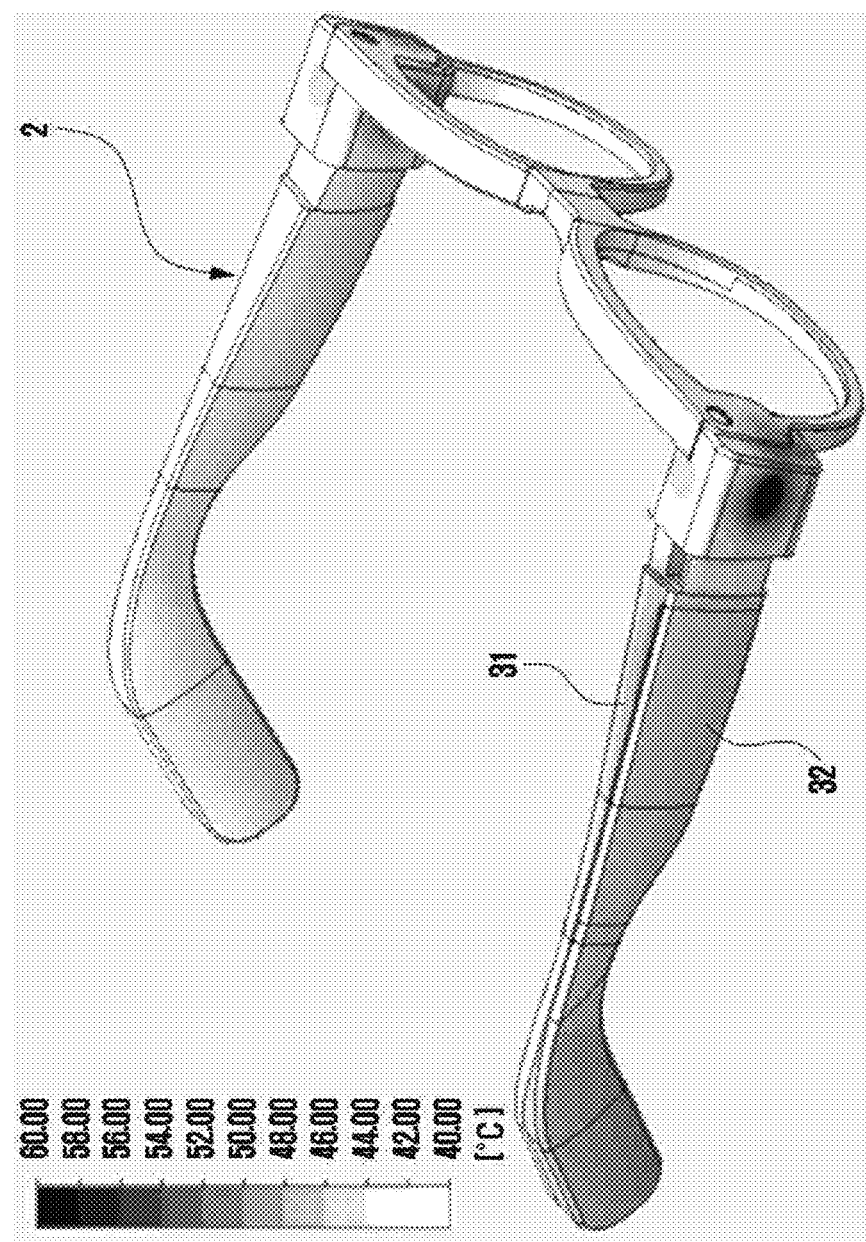
FIG. 13 illustrates a surface temperature distribution of an electronic device of FIG. 2 including a support part of FIG. 6, which contributes to a heat dissipation structure according to an embodiment of the disclosure.

FIG. 13 illustrates a surface temperature distribution of an electronic device 2 of FIG. 2 including a support part 60 of FIG. 6, which contributes to a heat dissipation structure according to an embodiment of the disclosure.

Figure 14:
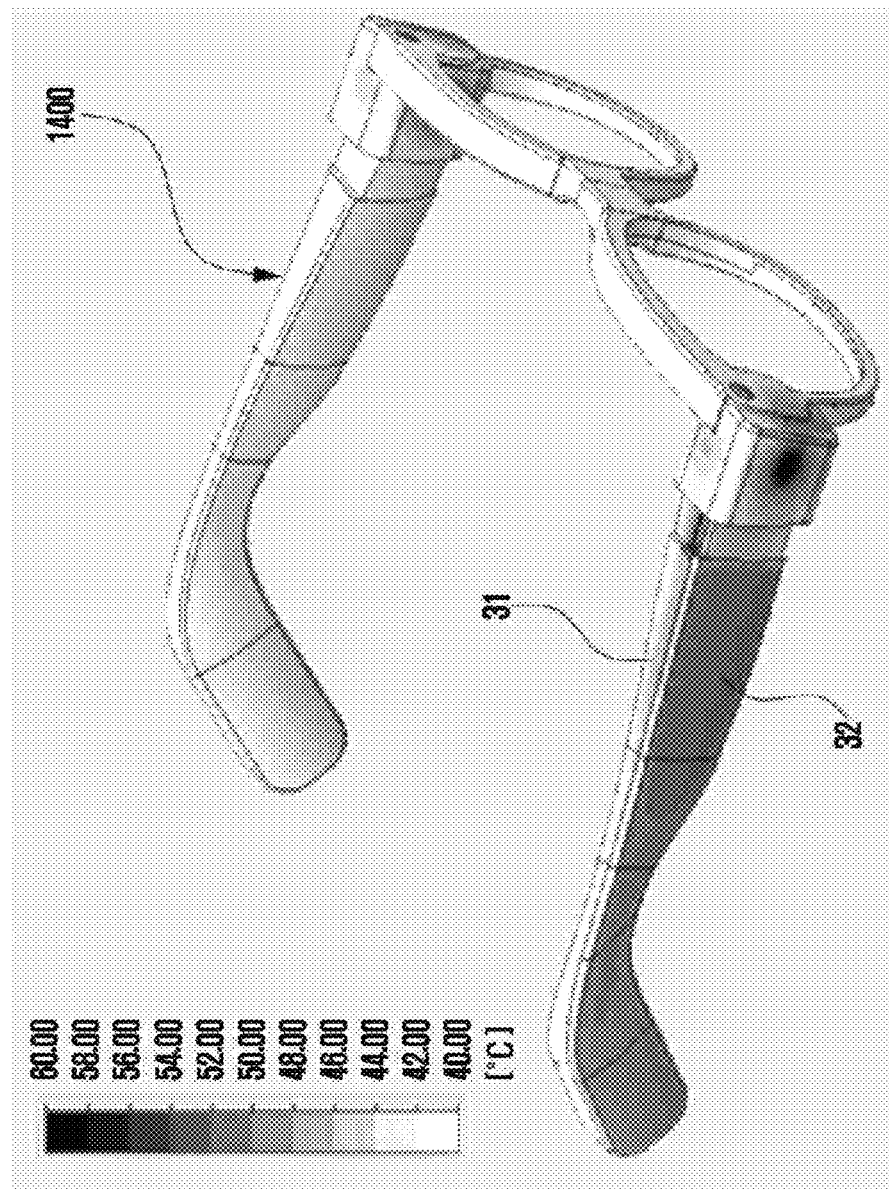
FIG. 14 illustrates a surface temperature distribution of an electronic device from which a support part of FIG. 6 is omitted, according to an embodiment of the disclosure.

FIG. 14 illustrates a surface temperature distribution of an electronic device 1400 from which a support part 60 of FIG. 6 is omitted, according to an embodiment of the disclosure. The below Table 1 illustrates surface temperature distributions of the first housing part 31 and the second housing part 32 for the embodiment of FIG. 13 and the embodiment of FIG. 14.

TABLE 1

| | Gap (G) | | 2 W | 1.8 W | 1.6 W | 1.4 W | 1.2 W |
|---|---|---|---|---|---|---|---|
| Embodiment of FIG. 13 | About 0.1 mm | First housing part | 44 | 42 | 40 | 38 | 37 |
| | | Second housing part | 46 | 44 | 42 | 40 | 39 |
| | About 1 mm | First housing part | 44 | 42 | 40 | 39 | 37 |
| | | Second housing part | 43 | 41 | 39 | 38 | 37 |
| | | Processor temperature | 59.6 | 56.7 | 53.5 | 50.5 | 47.3 |
| Embodiment of FIG. 14 | First housing part | | 45 | 44 | 42 | 40 | 38 |
| | Second housing part | | 53 | 51 | 49 | 46 | 43 |
| | Processor temperature | | 59.4 | 56.3 | 53.2 | 50.0 | 46.8 |

Temperature unit: ° C.

Referring to Table 1, a temperature diverged from a processor may be various according to driving power of a processor (e.g., the processor 120 of FIG. 1) (e.g., the first electronic component 710 of FIG. 7). In connection with the electronic device 2 according to the embodiment of FIG. 13, a surface temperature distribution of the housing part for a case in which the interval G between the support structures according to the embodiment of FIG. 6 is about 0.1 mm and about 1 mm is illustrated.

Referring to FIGS. 13 and 14 and Table 1, in a case where the support part 60 of FIG. 6, which contributes to a heat dissipation structure according to an embodiment of the disclosure, is included, the embodiment can have an improved heat dissipation effect in dissipating heat emitted from the processor so that a surface temperature of the housing part is further reduced in comparison to the otherwise case.

According to some embodiments of the disclosure, the wearable electronic device may not be limited to the embodiment of FIG. 2, and may be variously implemented. For example, the wearable electronic device may be implemented in a form, such as a headphone, an earset, or a watch, which allows same to be worn on a specific part of the body of a user. For another example, the wearable electronic device may be implemented in a form which enables same to be worn the body of a user so as to acquire various biometric information. In some embodiments of the disclosure, the wearable electronic device may not be limited to the body of a user, and may be implemented in a form which enables same to be attached to or detached from clothing of a user. In some embodiments of the disclosure, the wearable electronic device may be implemented without a display according to cases. The wearable electronic devices which may have various forms may include a heat dissipation structure for at least one electronic component positioned inside the housing part, and the heat dissipation structure may be implemented using the heat dissipation structure including the support part 60 described with reference to FIG. 6, 7, 8, 9, 10, 11, 12, or 13. In some embodiments of the disclosure, the heat dissipation structure including the support part 60 described with reference to FIG. 6, 7, 8, 9, 10, 11, 12, or 13 may not be limited to a wearable electronic device, and may be applied to various electronic devices, such as a portable communication device (e.g., a smart phone), a computer device, a portable multimedia device, a portable medical device, or a home appliance device.

According to an embodiment of the disclosure, a wearable electronic device (e.g., the wearable electronic device 2 of FIG. 2) may include a housing (e.g., the frame 20 of FIG. 2). The housing may include a first portion (e.g., the first housing part 31 of FIG. 3) constituting a first outer surface (e.g., the first outer surface 311 of FIG. 3) of the wearable electronic device and a second portion (e.g., the second housing part 32 of FIG. 3) constituting a second outer surface (e.g., the second outer surface 312 of FIG. 3) of the wearable electronic device. The wearable electronic device may include at least one electronic component (e.g., the first electronic component 710 or the second electronic component 720 of FIG. 7) which is positioned in an inner space of the housing and is configured to emit heat. The wearable electronic device may include multiple support structures (e.g., the support part 60 of FIG. 0.7) which are at least partially positioned to correspond to the at least one electronic component, between the first portion and the second portion. A boundary part (e.g., the boundary part 33 of FIG. 3) between the first portion and the second portion may be at least partially positioned along a surface boundary between the first outer surface and the second outer surface, and may include at least one opening (e.g., the opening 801 of FIG. 9). An at least one distancing space (e.g., the distancing space 62 of FIG. 7) between the multiple support structures may communicate with an outer space of the housing through the at least one opening.

According to an embodiment of the disclosure, the wearable electronic device may further include a heat conductive member (e.g., the heat conductive member 730 of FIG. 7) positioned between the at least one electronic component (e.g., the first electronic component 710 or the second electronic component 720 of FIG. 7) and the multiple support structures (e.g., a part 601 of the support part 60 of FIG. 7).

According to an embodiment of the disclosure, the heat conductive member (e.g., the heat conductive member 730 of FIG. 7) may include a heat spreader or a heat sink.

According to an embodiment of the disclosure, the heat conductive member (e.g., the heat conductive member 730 of FIG. 7) and the multiple support structures (e.g., at least a part of the support part 60 of FIG. 7) may be integrally formed and may include an identical material.

According to an embodiment of the disclosure, the wearable electronic device may further include a heat transfer material (e.g., the first heat transfer material 741 or the second heat transfer material 742 of FIG. 7) between the at least one electronic component (e.g., the first electronic component 710 or the second electronic component 720 of FIG. 7) and the heat conductive member (e.g., the heat conductive member 730 of FIG. 7).

According to an embodiment of the disclosure, the multiple support structures (e.g., the support part 60 of FIG. 7) may include a polymer.

According to an embodiment of the disclosure, the housing (e.g., the first temple 210 of FIG. 6) may be integrally formed with the multiple support structures (e.g., the support part 60 of FIG. 6) and may include the same material as that of the multiple support structures.

According to an embodiment of the disclosure, at least a part of the multiple support structures may be arranged at a predetermined gap.

According to an embodiment of the disclosure, a part of the multiple support structures may be arranged at a first gap, and a part of another of the multiple support structures may be arranged at a second gap different from the first gap.

According to an embodiment of the disclosure, at least a part of the multiple support structures may have a predetermined thickness.

According to an embodiment of the disclosure, a part of the multiple support structures may have a first thickness, and a part of another of the multiple support structures may have a second thickness different from the first thickness.

According to an embodiment of the disclosure, the at least one opening (e.g., the opening 801 of FIG. 9) may have a form configured to prevent the inner space of the housing (e.g., the first temple 210 of FIG. 3) from being seen.

According to an embodiment of the disclosure, the housing (e.g., the frame 21 of FIG. 2) may be configured to be wearable on a head.

According to an embodiment of the disclosure, the wearable electronic device may further include a transparent display (e.g., the first transparent display 23 or the second transparent display 24 of FIG. 2) positioned in the housing to face the eyes when the housing (e.g., the frame 20 of FIG. 2) is worn on the head.

According to an embodiment of the disclosure, the wearable electronic device (e.g., the wearable electronic device 2 of FIG. 2) may be an eyeglasses type. The housing (e.g., the frame 21 of FIG. 2) may include a temple (e.g., the first temple 210 or the second temple 220 of FIG. 2).

According to an embodiment of the disclosure, a wearable electronic device (e.g., the wearable electronic device 2 of FIG. 2) may include a housing (e.g., the frame 21 of FIG. 2). The housing may be configured to be wearable on a head, and may include a first portion (e.g., the first housing part 31 of FIG. 3) constituting a first outer surface (e.g., the first outer surface 311 of FIG. 3) of the wearable electronic device and a second portion (e.g., the second housing part 32 of FIG. 3) constituting a second outer surface (e.g., the second outer surface 312 of FIG. 3) of the wearable electronic device. The wearable electronic device may include a transparent display (e.g., the first transparent display 23 or the second transparent display 24 of FIG. 2) positioned in the housing to face the eyes when the housing is worn on the head. The wearable electronic device may include at least one electronic component (e.g., the first electronic component 710 or the second electronic component 720 of FIG. 7)

which is positioned in an inner space of the housing and is configured to emit heat. The wearable electronic device may include multiple support structures (e.g., the support part 60 of FIG. 7) which are at least partially positioned to correspond to the at least one electronic component, between the first portion and the second portion. A boundary part (e.g., the boundary part 33 of FIG. 3) between the first portion and the second portion may be at least partially positioned along a surface boundary between the first outer surface and the second outer surface and may include at least one opening (e.g., the opening 801 of FIG. 9). An at least one distancing space (e.g., the distancing space 62 of FIG. 7) between the multiple support structures may be configured to communicate with an outer space of the housing through the at least one opening.

According to an embodiment of the disclosure, the wearable electronic device may be an eyeglasses type. The housing may include a temple.

According to an embodiment of the disclosure, the wearable electronic device may further include a heat conductive member (e.g., the heat conductive member 730 of FIG. 7) positioned between the at least one electronic component (e.g., the first electronic component 710 or the second electronic component 720 of FIG. 7) and the multiple support structures (e.g., a part 601 of the support part 60 of FIG. 6).

According to an embodiment of the disclosure, the heat conductive member (e.g., the heat conductive member 730 of FIG. 7) and the multiple support structures (e.g., a part 601 of the support part 60 of FIG. 6) may be integrally formed and may include an identical material.

According to an embodiment of the disclosure, the wearable electronic device may further include a heat transfer material (e.g., the first heat transfer material 741 or the second heat transfer material 742 of FIG. 7) between the at least one electronic component (e.g., the first electronic component 710 or the second electronic component 720 of FIG. 7) and the heat conductive member (e.g., the heat conductive member 730 of FIG. 7).

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A wearable electronic device comprising:
   a housing comprising a first portion and a second portion, the first portion forming a first outer surface of the wearable electronic device and the second portion forming a second outer surface of the wearable electronic device;
   at least one electronic component positioned in an inner space of the housing and configured to emit heat; and
   multiple support structures which are at least partially positioned to correspond to the at least one electronic component between the first portion and the second portion,
   wherein the multiple support structures are at least partially separated from each other,
   wherein one or more support structures among the multiple support structures are configured to protrude toward the at least one electronic component to be in indirect contact with the at least one electronic component,
   wherein a boundary part between the first portion and the second portion is at least partially positioned along a surface boundary between the first outer surface and the second outer surface and comprises at least one opening, and
   wherein an at least one distancing space between the multiple support structures is configured to communicate with an outer space of the housing through the at least one opening.

2. The wearable electronic device of claim 1, further comprising:
   a heat conductive member positioned between the at least one electronic component and the multiple support structures.

3. The wearable electronic device of claim 2, wherein the heat conductive member comprises a heat spreader or a heat sink.

4. The wearable electronic device of claim 2, wherein the heat conductive member and the multiple support structures are integrally formed and comprise an identical material.

5. The wearable electronic device of claim 4, further comprising:
   a heat transfer material disposed between the at least one electronic component and the heat conductive member.

6. The wearable electronic device of claim 1, wherein the multiple support structures comprise a polymer.

7. The wearable electronic device of claim 6, wherein the housing is integrally formed with the multiple support structures and comprises a same material as that of the multiple support structures.

8. The wearable electronic device of claim 1, wherein at least a part of the multiple support structures is arranged at a predetermined gap.

9. The wearable electronic device of claim 1,
   wherein a part of the multiple support structures is arranged at a first gap, and
   wherein a part of another of the multiple support structures is arranged at a second gap different from the first gap.

10. The wearable electronic device of claim 1, wherein at least a part of the multiple support structures has a predetermined thickness.

11. The wearable electronic device of claim 1,
    wherein a part of the multiple support structures has a first thickness, and
    wherein a part of another of the multiple support structures has a second thickness different from the first thickness.

12. The wearable electronic device of claim 1, wherein the at least one opening has a form configured to prevent the inner space of the housing from being seen.

13. The wearable electronic device of claim 1, wherein the housing is configured to be wearable on a head of a user.

14. The wearable electronic device of claim 13, further comprising:
    a transparent display positioned in the housing to face eyes of the user when the housing is worn on the head of the user.

15. The wearable electronic device of claim 1,
    wherein the wearable electronic device is an eyeglasses type, and
    wherein the housing comprises a temple.

16. The wearable electronic device of claim 1,
    wherein the boundary part includes a first boundary part extending in a first direction, a second boundary part extending in the first direction, and a third boundary part connecting the first boundary part to the second boundary part, wherein the multiple support structures extend from the first boundary part toward the second boundary part, and wherein the heat emitted by the at least one electronic component is emitted to an outer space of the housing through the at least one opening of the boundary part between the first portion and the second portion.

17. A wearable electronic device comprising:

a housing configured to be wearable on a head of a user and comprising a first portion and a second portion, the first portion forming a first outer surface of the wearable electronic device and the second portion forming a second outer surface of the wearable electronic device;

a transparent display positioned in the housing to face eyes of the user when the housing is worn on the head of the user;

at least one electronic component positioned in an inner space of the housing and configured to emit heat; and multiple support structures which are at least partially positioned to correspond to the at least one electronic component between the first portion and the second portion, wherein a boundary part between the first portion and the second portion is at least partially positioned along a surface boundary between the first outer surface and the second outer surface and comprises at least one opening, and wherein an at least one distancing space between the multiple support structures is configured to communicate with an outer space of the housing through the at least one opening.

18. The wearable electronic device of claim 17, wherein the wearable electronic device is an eyeglasses type, and wherein the housing comprises a temple.

19. The wearable electronic device of claim 17, further comprising:

a heat conductive member positioned between the at least one electronic component and the multiple support structures.

20. The wearable electronic device of claim 19, wherein the heat conductive member and the multiple support structures are integrally formed and comprise an identical material.

21. The wearable electronic device of claim 19, further comprising:

a heat transfer material disposed between the at least one electronic component and the heat conductive member.

* * * * *